US012787492B2

(12) United States Patent
Yamada et al.

(10) Patent No.: US 12,787,492 B2
(45) Date of Patent: Nov. 3, 2026

(54) EPITAXIAL WAFER FOR ULTRAVIOLET LIGHT EMITTING DEVICE, METHOD FOR PRODUCING METAL BONDED SUBSTRATE FOR ULTRAVIOLET LIGHT EMITTING DEVICE, METHOD FOR PRODUCING ULTRAVIOLET LIGHT EMITTING DEVICE, AND METHOD FOR PRODUCING ULTRAVIOLET LIGHT EMITTING DEVICE ARRAY

(71) Applicants: SHIN-ETSU HANDOTAI CO., LTD., Tokyo (JP); SHIN-ETSU CHEMICAL CO., LTD., Tokyo (JP)

(72) Inventors: Masato Yamada, Chiyoda-ku (JP); Junya Ishizaki, Takasaki (JP); Keitaro Tsuchiya, Takasaki (JP); Yoshihiro Kubota, Annaka (JP); Minoru Kawahara, Saitama (JP)

(73) Assignees: SHIN-ETSU HANDOTAI CO., LTD., Tokyo (JP); SHIN-ETSU CHEMICAL CO., LTD., Tokyo (JP)

(*) Notice: Subject to any disclaimer, the term of this patent is extended or adjusted under 35 U.S.C. 154(b) by 645 days.

(21) Appl. No.: 18/028,581

(22) PCT Filed: Aug. 26, 2021

(86) PCT No.: PCT/JP2021/031380

§ 371 (c)(1),
(2) Date: Mar. 27, 2023

(87) PCT Pub. No.: WO2022/070699

PCT Pub. Date: Apr. 7, 2022

(65) Prior Publication Data

US 2023/0343890 A1 Oct. 26, 2023

(30) Foreign Application Priority Data

Sep. 30, 2020 (JP) ................................ 2020-164279

(51) Int. Cl.
*H10H 20/01* (2025.01)
*H10P 14/20* (2026.01)
*H10P 14/24* (2026.01)

(52) U.S. Cl.
CPC ....... *H10H 20/01335* (2025.01); *H10P 14/24* (2026.01); *H10P 14/3216* (2026.01);
(Continued)

(58) Field of Classification Search
CPC ....... C30B 29/68; C30B 29/403; C30B 25/02; C30B 29/38; H10P 14/24; H10P 14/3216;
(Continued)

(56) References Cited

U.S. PATENT DOCUMENTS

2007/0126017 A1 6/2007 Krames et al.
2008/0261378 A1 10/2008 Yao et al.
(Continued)

FOREIGN PATENT DOCUMENTS

CN 102484173 A 5/2012
JP 2005259912 A * 9/2005
(Continued)

OTHER PUBLICATIONS

Nov. 9, 2021 International Search Report issued in PCT/JP2021/031380.
(Continued)

*Primary Examiner* — Julio J Maldonado
*Assistant Examiner* — Paul A Berry
(74) *Attorney, Agent, or Firm* — Oliff PLC

(57) ABSTRACT

An epitaxial wafer for an ultraviolet light emitting device, including, a heat-resistant first support substrate, a planarization layer with a thickness of 0.5 to 3 μm on at least upper surface of the first support substrate, a group III nitride single crystal seed crystal layer with a thickness of 0.1 to 1.5 μm, bonds to upper surface of the planarization layer by
(Continued)

bonding, on the seed crystal layer, an epitaxial layer including at least a first conductivity type cladding layer containing $Al_xGa_{1-x}N$ ($0.5<x\leq1$) as a main component, an AlGaN-based active layer, and a second conductivity type cladding layer containing $Al_yGa_{1-y}N$ ($0.5<y\leq1$) as a main component being laminated and grown in order. Thus, an epitaxial wafer for an ultraviolet light emitting device enables high quality light emitting devices in the deep ultraviolet region (UVC: 200 to 250 nm) to be manufactured at a lower cost than before.

14 Claims, 15 Drawing Sheets

(52) U.S. Cl.
CPC ...... *H10P 14/3251* (2026.01); *H10P 14/3416* (2026.01); *H10P 14/3442* (2026.01)

(58) Field of Classification Search
CPC ............. H10P 14/3251; H10P 14/3416; H10P 14/3442; H10P 14/3202; H10P 14/3444; H10P 14/2908; H10P 14/3238; H10P 90/00; H10P 14/6349; H10P 14/274; H10P 14/3214; H10P 10/126; H10H 20/01335; H10H 20/0137; H10H 20/018; H10H 20/80; H10H 20/8585; H10H 20/825; H10H 20/019; H10H 20/815; H10H 20/013; H10H 20/817; H10H 20/814; H10H 20/835; H10H 20/84; H10H 20/841; H10H 20/81; H10H 20/83; H10H 20/011; H10H 20/01
See application file for complete search history.

(56) References Cited

U.S. PATENT DOCUMENTS

2011/0057165 A1 3/2011 Pinnington
2012/0074383 A1* 3/2012 Liu .................. H10H 20/01335 257/13
2013/0292640 A1* 11/2013 Xiao .................... H10H 20/018 438/26
2014/0070166 A1 3/2014 Pinnington
2014/0183442 A1* 7/2014 Odnoblyudov ...... H10D 62/824 257/190
2015/0247260 A1 9/2015 Koukitu et al.
2016/0164260 A1 6/2016 Chua et al.
2016/0172534 A1* 6/2016 Iwata ................... H10H 20/812 438/47
2017/0110314 A1* 4/2017 Odnoblyudov ..... H01L 21/6835
2018/0138357 A1* 5/2018 Henley ............. H01L 21/76254
2020/0234945 A1 7/2020 Odnoblyudov et al.
2022/0359479 A1* 11/2022 Feuillet ................ H10H 29/142

FOREIGN PATENT DOCUMENTS

JP 2007-184503 A 7/2007
JP 2012-142385 A 7/2012
JP 6042545 B2 12/2016
JP 2019220535 A * 12/2019
JP 2020-513681 A 5/2020
JP 2020-109817 A 7/2020
KR 20210070833 A * 6/2021 ........... H10H 20/857
TW 200531317 A 9/2005
TW 201133919 A 10/2011
TW 201836168 A 10/2018
WO 2006/126330 A1 11/2006

OTHER PUBLICATIONS

Mar. 28, 2023 International Preliminary Report on Patentability issued in International Patent Application No. PCT/JP2021/031380.
May 2, 2023 Notification of Reasons for Refusal issued in Japanese Patent Application No. 2020-164279.
Aug. 5, 2025 Office Action issued in Taiwanese Patent Application No. 110132772.
Oct. 1, 2024 Extended Search Report issued in European Patent Application No. 21875002.4.
May 8, 2026 Office Action issued in Taiwanese Patent Application No. 110132772.
Jun. 26, 2026 Office Action issued in Chinese Patent Application No. 202180066639.8.

* cited by examiner

[FIG. 1]
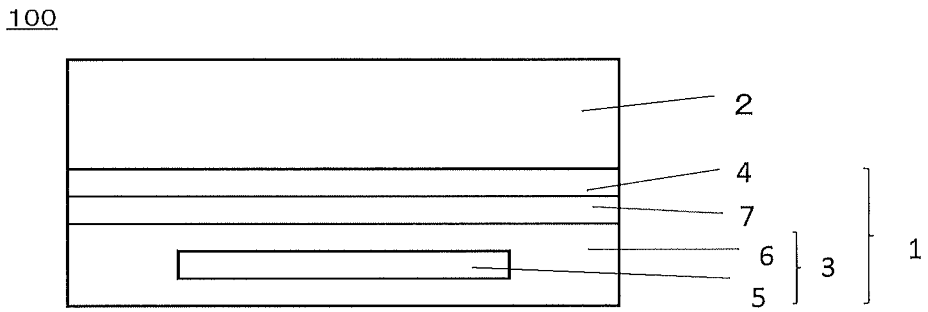
[FIG. 2]
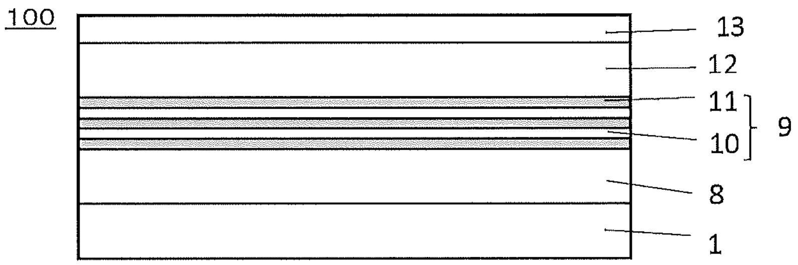
[FIG. 3]
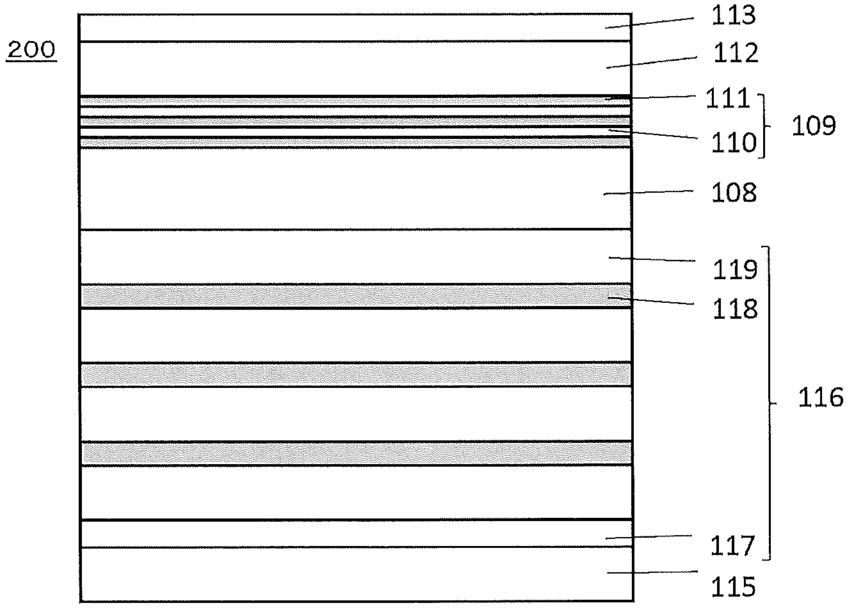

[FIG. 4]
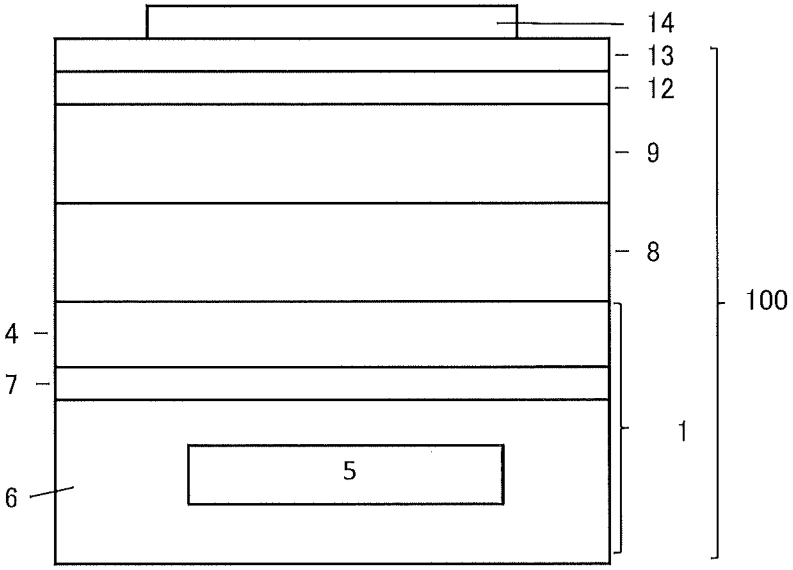
[FIG. 5]
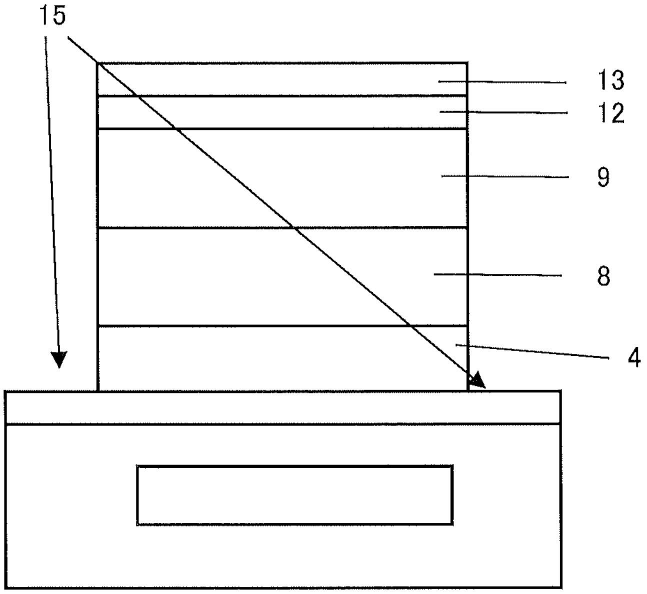

[FIG. 6]
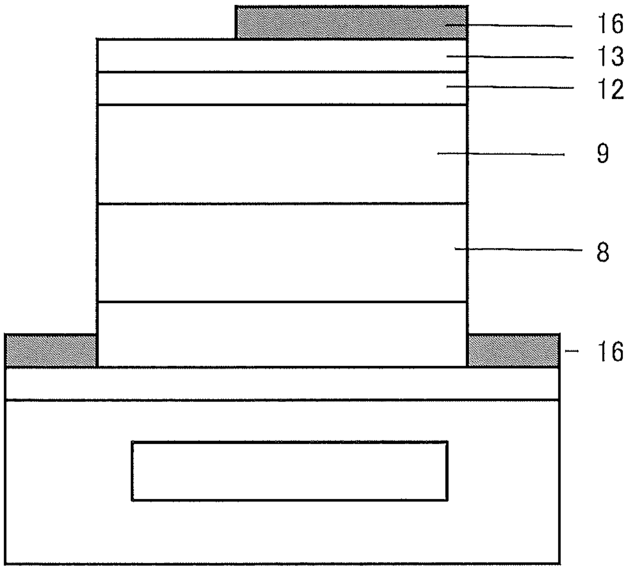
[FIG. 7]
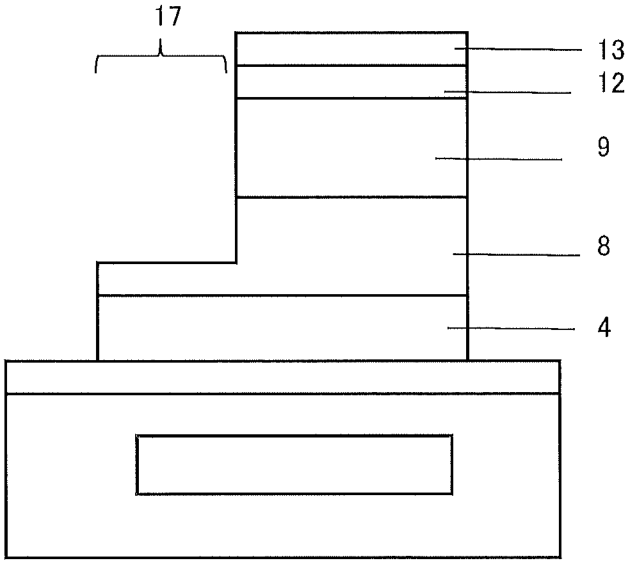

[FIG. 8]
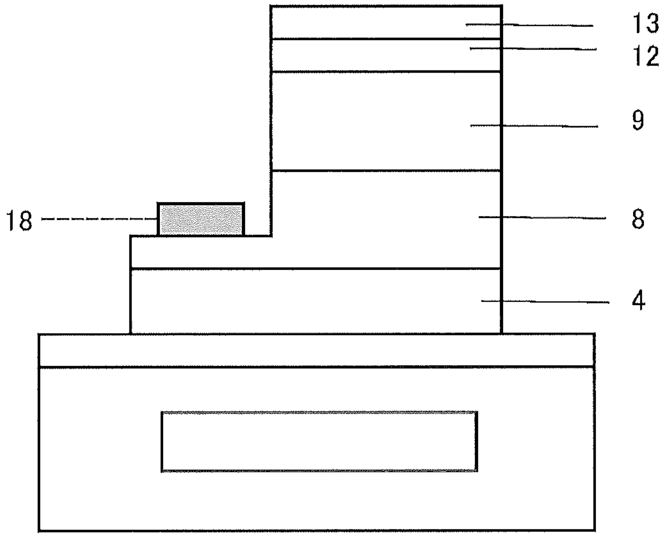
[FIG. 9]
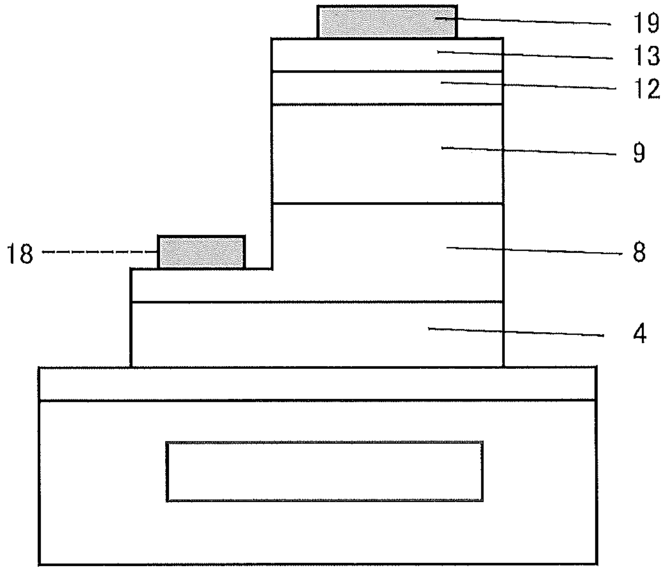

[FIG. 10]
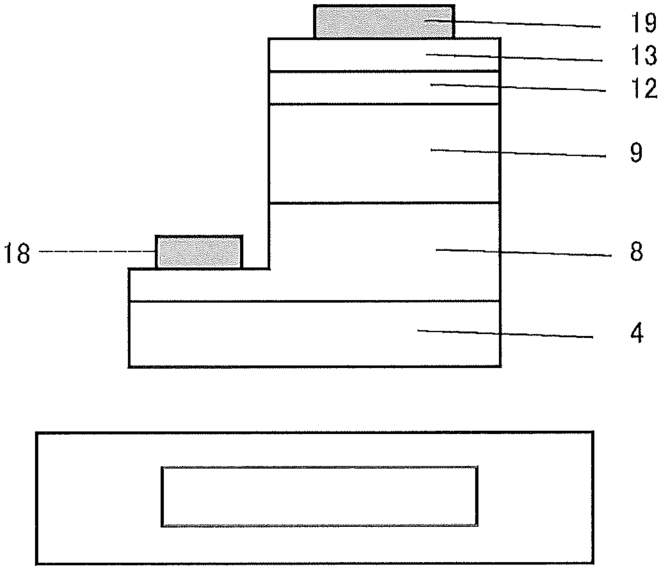
[FIG. 11]
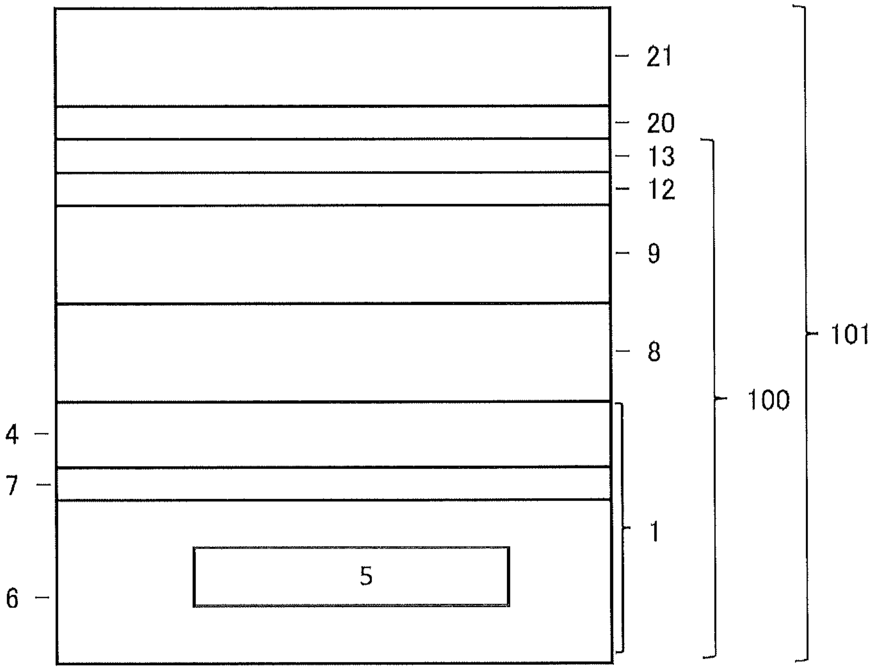

[FIG. 12]
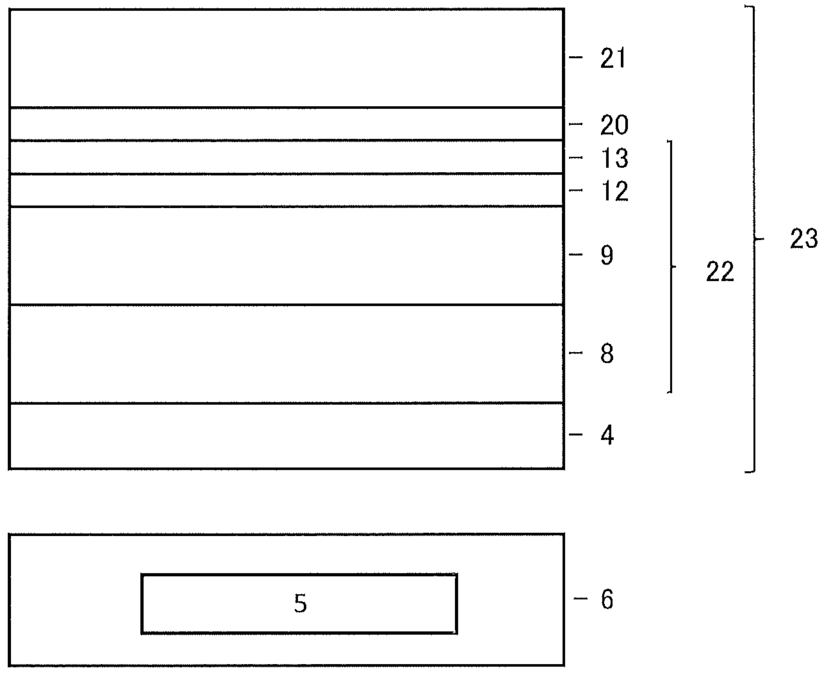
[FIG. 13]
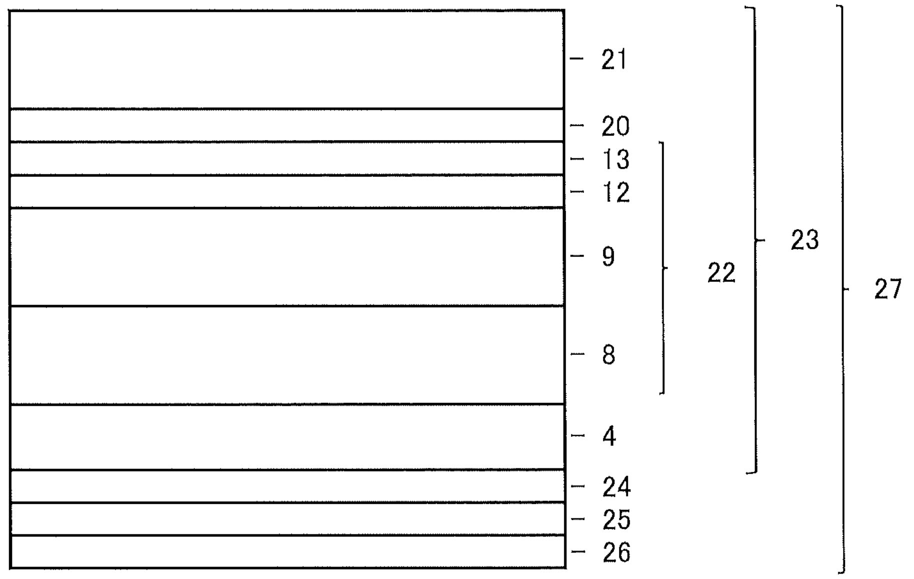

[FIG. 14]
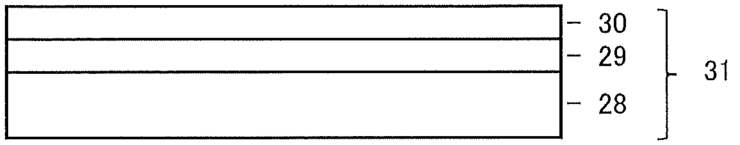
[FIG. 15]
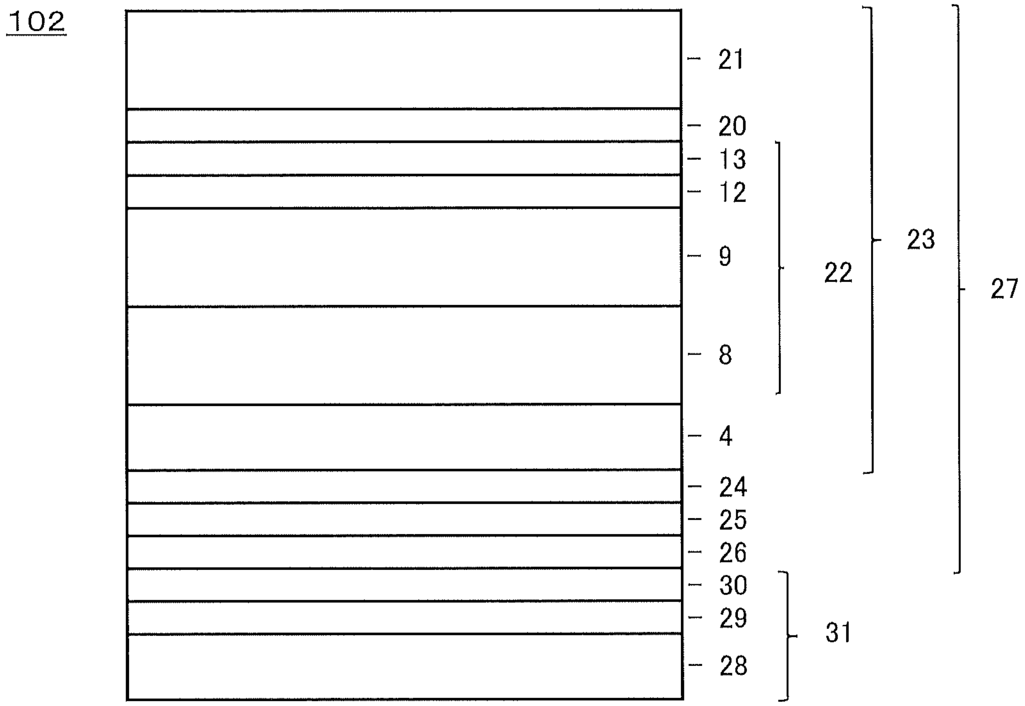

[FIG. 16]
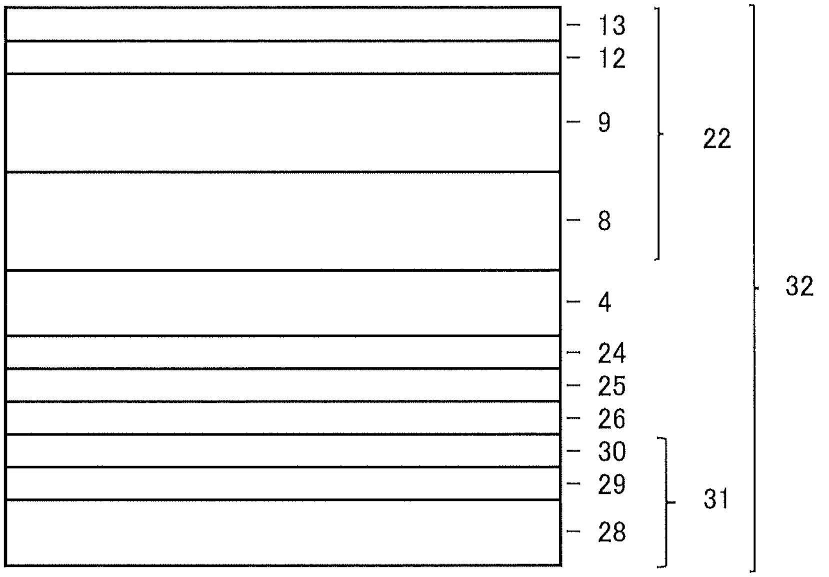
[FIG. 17]
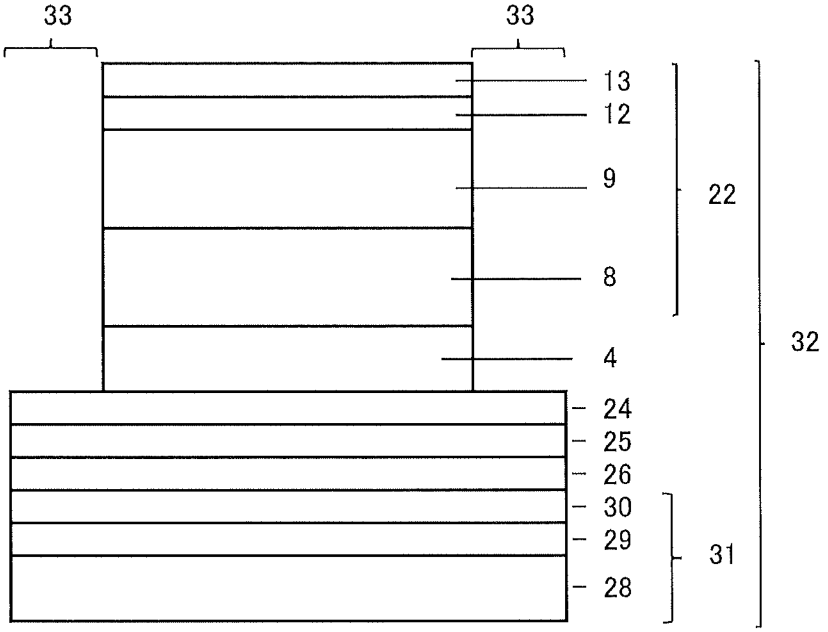

[FIG. 18]
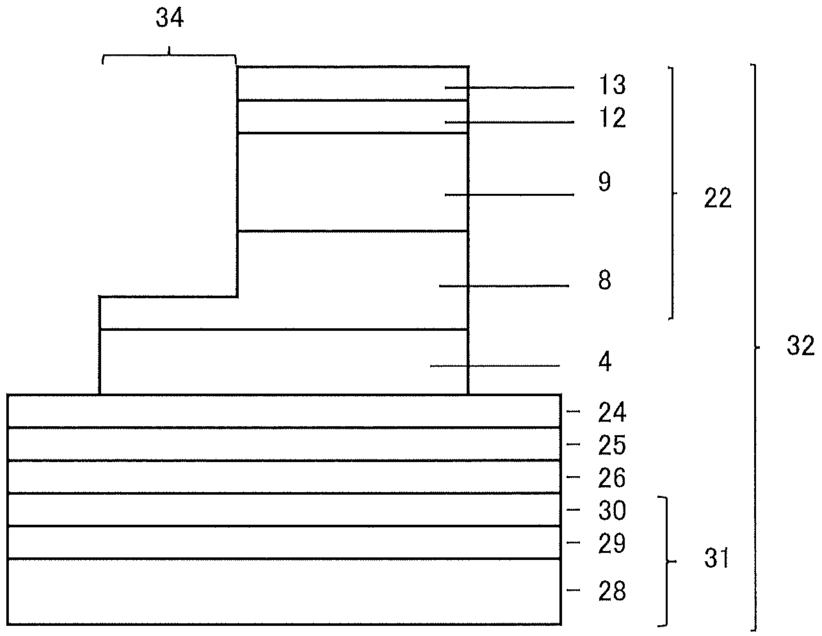
[FIG. 19]
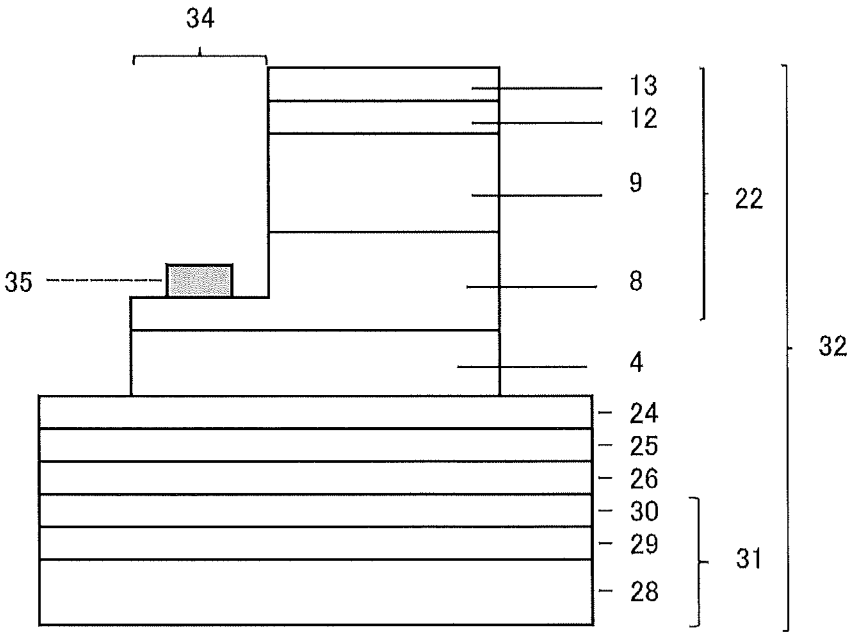

[FIG. 20]
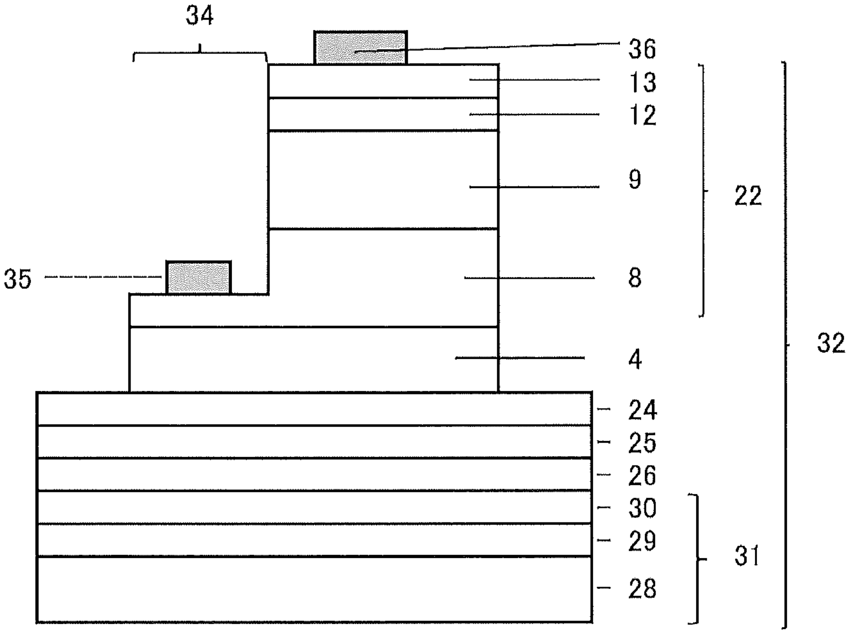
[FIG. 21]
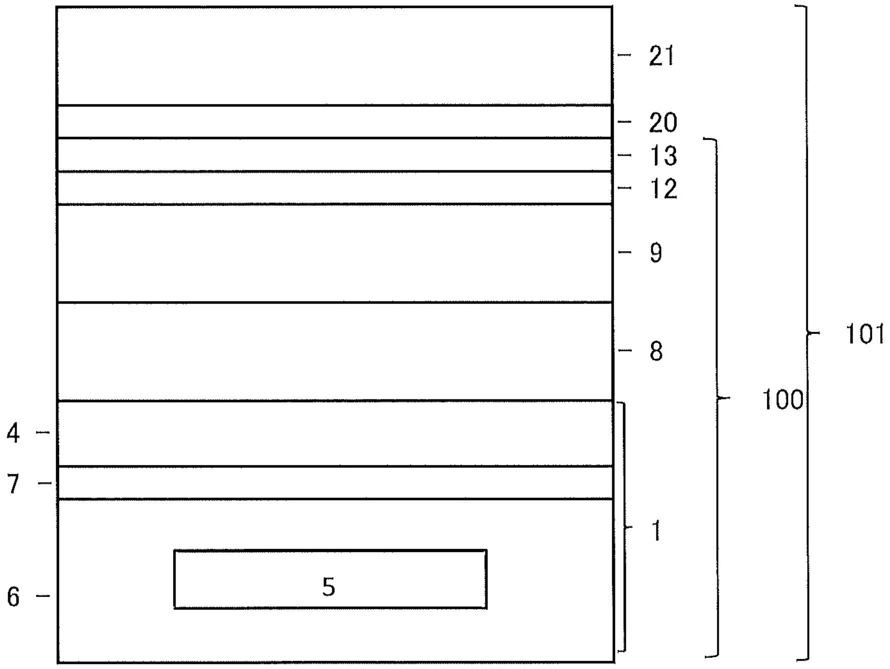

[FIG. 22]
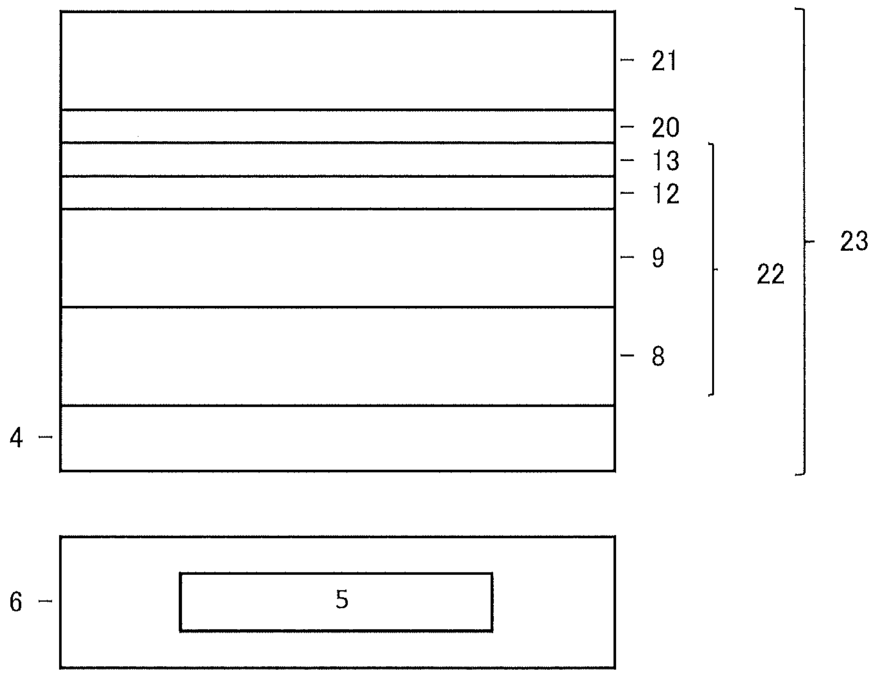
[FIG. 23]
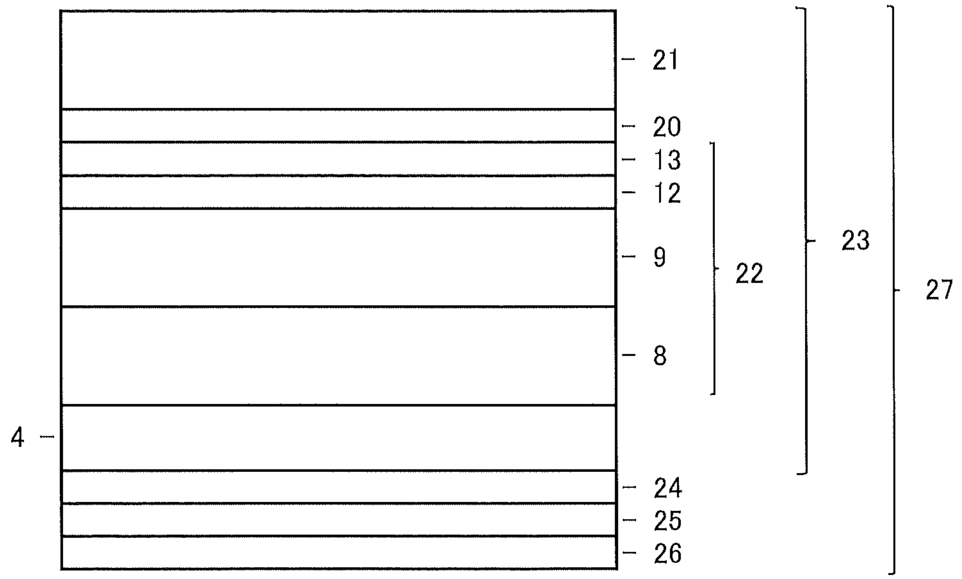

[FIG. 24]
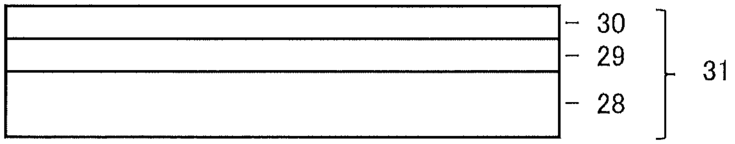
[FIG. 25]
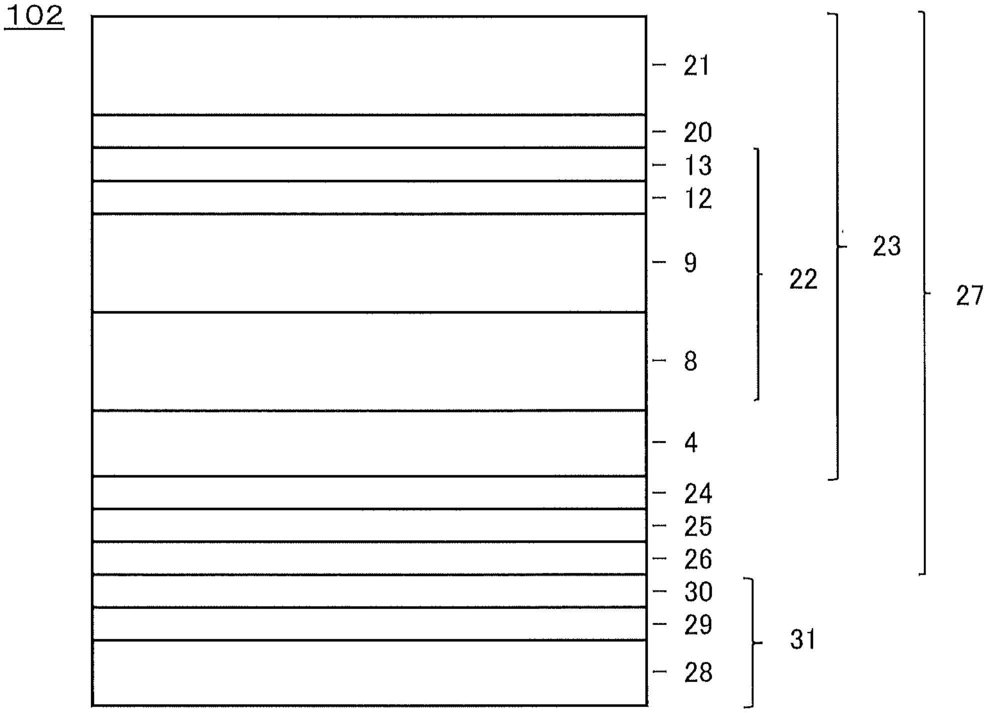

[FIG. 26]
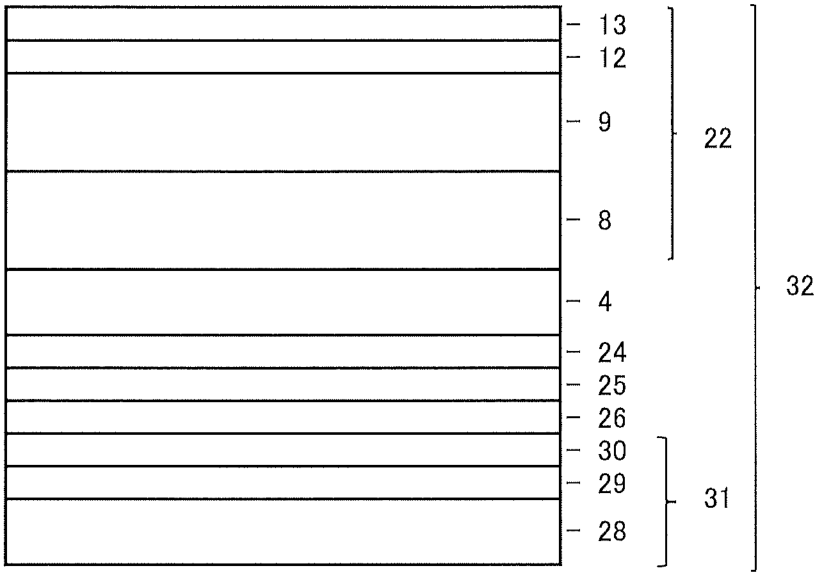
[FIG. 27]
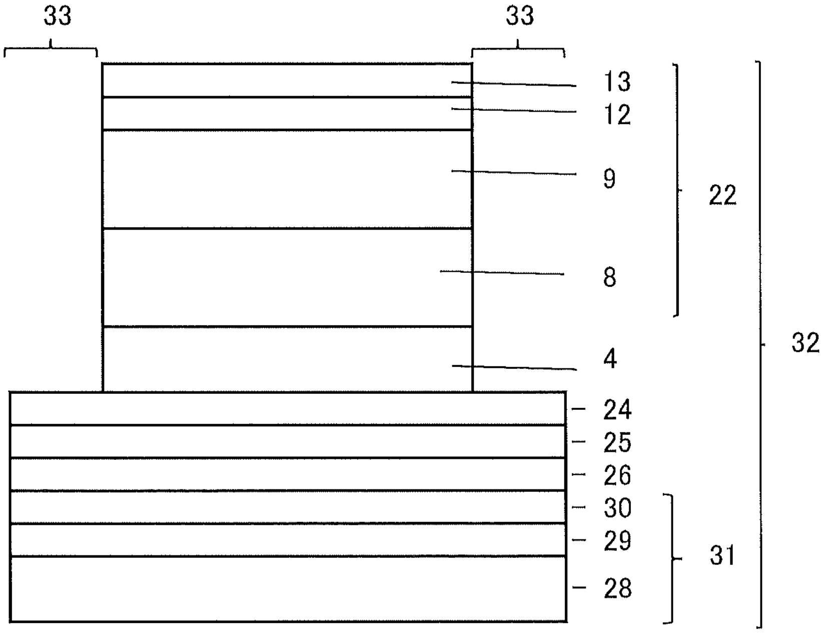

[FIG. 28]
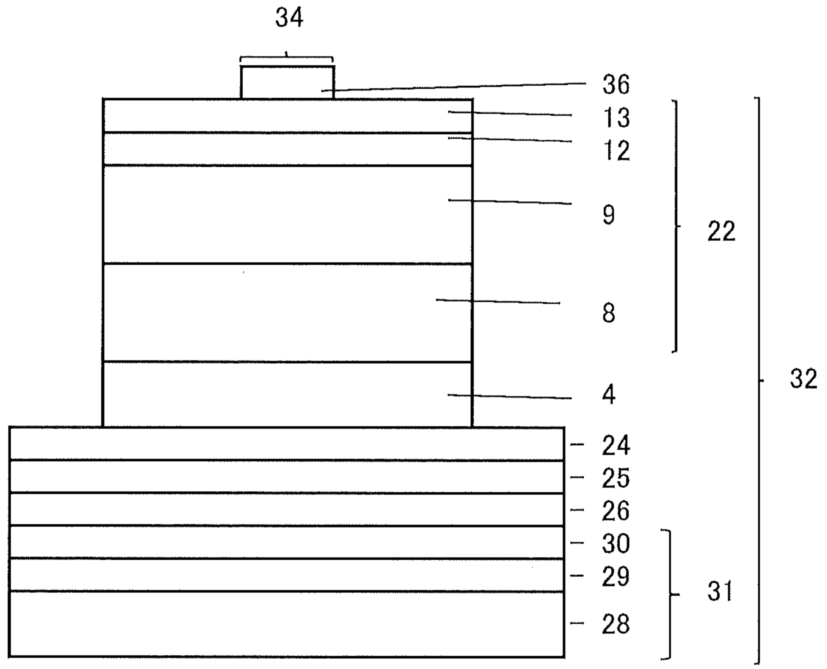
[FIG. 29]
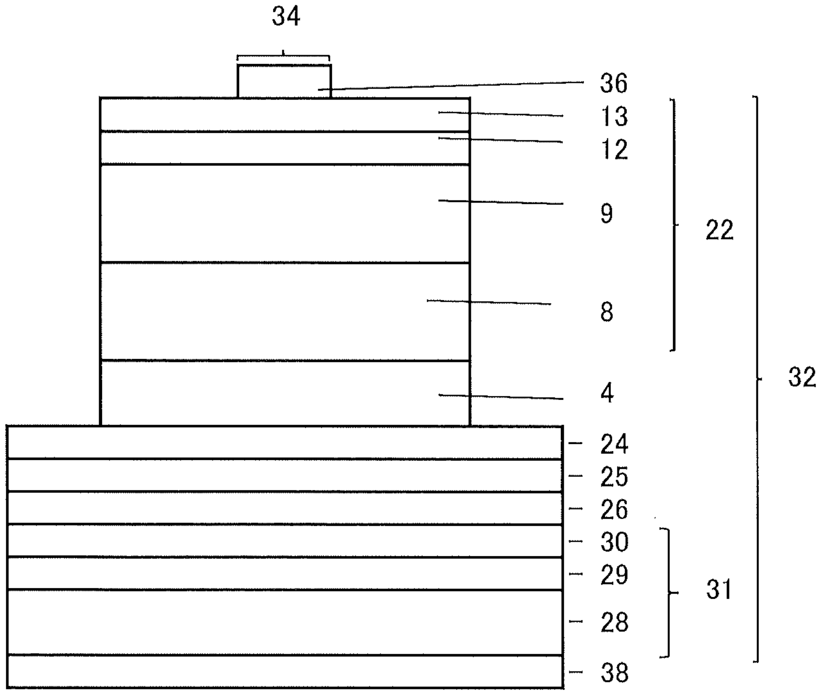

[FIG. 30]
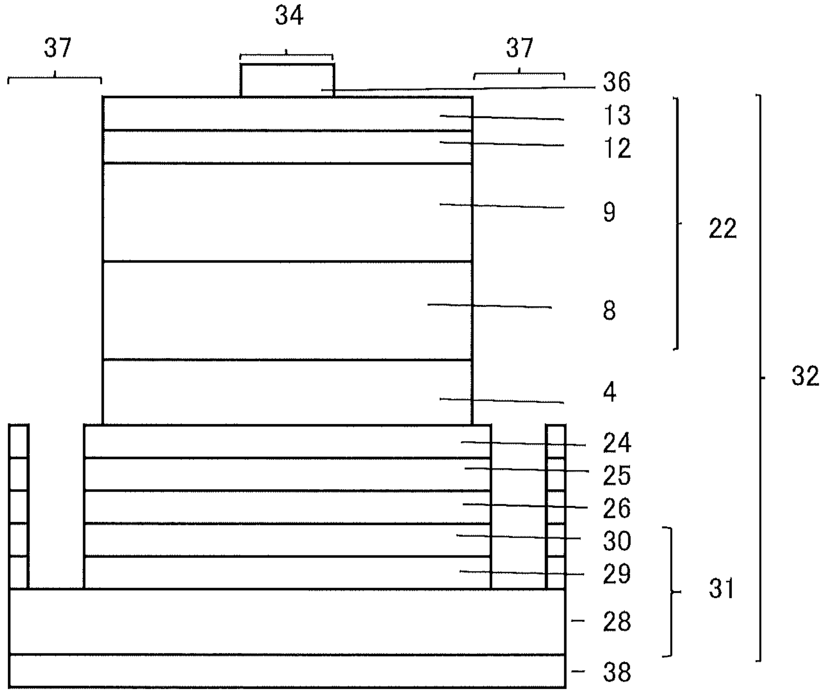
[FIG. 31]
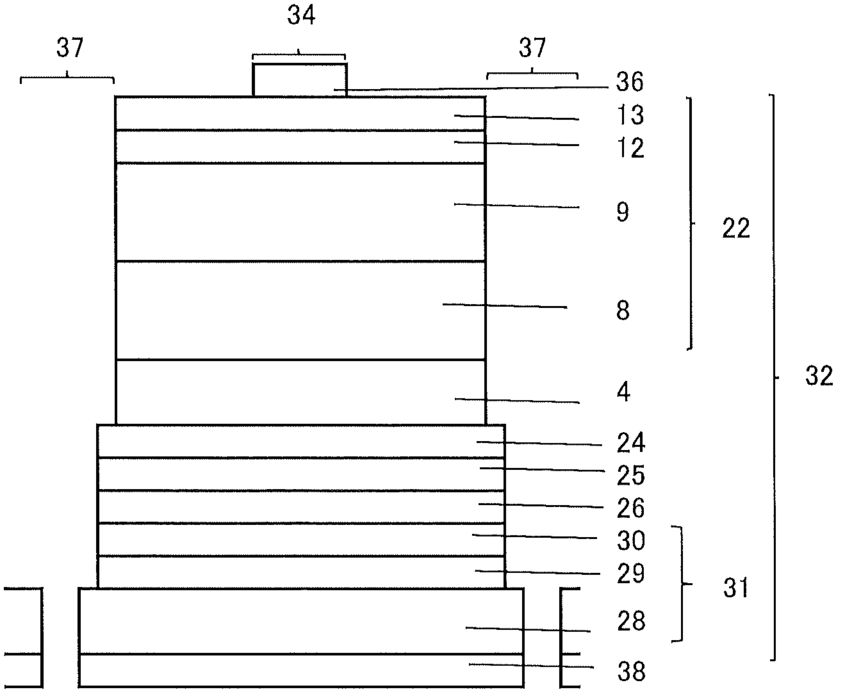

EPITAXIAL WAFER FOR ULTRAVIOLET LIGHT EMITTING DEVICE, METHOD FOR PRODUCING METAL BONDED SUBSTRATE FOR ULTRAVIOLET LIGHT EMITTING DEVICE, METHOD FOR PRODUCING ULTRAVIOLET LIGHT EMITTING DEVICE, AND METHOD FOR PRODUCING ULTRAVIOLET LIGHT EMITTING DEVICE ARRAY

TECHNICAL FIELD

The present invention relates to an epitaxial wafer for an ultraviolet light emitting device, a method for producing a metal bonded substrate for ultraviolet light emitting device, a method for producing an ultraviolet light emitting device, and a method for producing an ultraviolet light emitting device array.

BACKGROUND ART

In recent years, the market for deep ultraviolet light emitting diodes using nitride based semiconductor materials is expected to expand as a light source for sterilization from the viewpoints of mercury-free, long life, compactness, weight reduction, energy saving, etc. However, these epitaxial layers for light emitting diodes for deep ultraviolet light, AlN layers are grown by hydride vapor phase epitaxy (HVPE) using a sapphire substrate or an AlN substrate as a base substrate (Patent Document 1). When formed on a material substrate with a different lattice constant, such as sapphire or SiC, defects due to lattice mismatch generate, which tends to lower internal quantum efficiency and lower energy conversion efficiency. Moreover, in case of wavelength shorter than 250 nm, the effect becomes even more pronounced. In addition, the GaN single crystal free-standing substrate having a relatively close lattice constant becomes a light absorbing substrate due to its bandgap, which lowers external quantum efficiency. AlN single crystal free-standing substrates are promising as very high quality epitaxial substrates, but they are difficult to produce and are very expensive materials.

Therefore, there was a problem with spread of high output, high efficiency deep ultraviolet light emitting diodes for sterilization.

CITATION LIST

Patent Literature

Patent Document 1: Japanese Patent No. 6042545

SUMMARY OF INVENTION

Technical Problem

The present invention has been made in view of the above circumstances, and an object of the present invention is to provide a method for producing an epitaxial wafer for an ultraviolet light emitting device that enables the production of high quality light emitting devices in deep ultraviolet region (UVC: 200 to 250 nm) at a lower cost than before, a method for producing a substrate for metal bonding for an ultraviolet light emitting device, a method for producing an ultraviolet light emitting device, and a method for producing an ultraviolet light emitting device array.

Solution to Problem

In order to achieve the above object, the present invention provides an epitaxial wafer for an ultraviolet light emitting device, comprising, a heat-resistant first support substrate, a planarization layer with a thickness of 0.5 to 3 μm provided on at least upper surface of the first supporting substrate, a group III nitride single crystal seed crystal layer with a thickness of 0.1 to 1.5 μm, which is bonded to upper surface of the planarization layer by bonding, on the seed crystal layer, an epitaxial layer comprising at least a first conductivity type cladding layer containing $Al_xGa_{1-x}N$ ($0.5<x\leq1$) as a main component, an AlGaN-based active layer, and a second conductivity type cladding layer containing $Al_yGa_{1-y}N$ ($0.5<y\leq1$) as a main component being laminated and grown in order.

Such an epitaxial wafer for an ultraviolet light emitting device, it can be provided an epitaxial wafer from which ultraviolet light emitting device with simple structure and high quality without warpage or defects due to lattice mismatch can be produced, since it comprises the above heat-resistant first support substrate, a planarization layer with a thickness of 0.5 to 3 μm, and a seed crystal layer of group III nitride single crystal with a thickness of 0.1 to 1.5 μm bonded by bonding, and an epitaxial layer is grown laminated thereon. Moreover, since the expensive seed crystal layer can be made extremely thin, it can be produced at extremely low cost.

Further, the first support substrate is composed of a ceramics core layer and an impurity encapsulation layer encapsulating the ceramics core layer, and the impurity encapsulation layer is represented by a composition formula of $SiO_xN_y$ (x=0 to 2, y=0 to 1.5, x+y>0).

With such a structure, it becomes possible to more reliably produce high quality ultraviolet light emitting devices in which crystal defects are suppressed.

Further, the ceramics core layer may be mainly composed of polycrystalline AlN ceramics.

Such a material is preferable because it is excellent in heat resistance and stability, and large-diameter sizes can be obtained at low cost.

Also, the planarization layer may be made of at least one materials selected from $SiO_2$, silicon oxynitride ($Si_xO_yN_z$), Si, and AlAs.

Such a material is preferable because it facilitates grinding and polishing during planarization and easily serves as a sacrificial layer for separating the first support substrate.

Further, the seed crystal layer may be a single crystal of $Al_xGa_{1-x}N$ ($0.5<X\leq1$).

Such a material is preferable because it can be matched the composition of the layer epitaxially grown thereon.

Further, the AlGaN-based active layer may have an MQW structure, containing In as a constituent element other than Al, Ga, and N, and the ratio of In is less than 1%.

Such a thing is preferable because it can emit light more efficiently.

Further, the AlGaN-based active layer may have a peak wavelength λp of an emission spectrum shorter than 235 nm when a current of 0.2 $A/mm^2$ is injected at 25° C.

With such a thing, light in the deep ultraviolet region can be obtained more reliably.

Further, a bandgap of the seed crystal layer may be larger than a bandgap of the AlGaN-based active layer.

Such a thing is preferable because it can extract light more efficiently.

Further, the seed crystal layer may have an epitaxial growth surface which is a C-plane.

Such a thing is preferable because it can emit light more efficiently.

Further, the present invention provides a method for producing an ultraviolet light emitting device, comprising,

- preparing the above epitaxial wafer for an ultraviolet light emitting device,
- removing part of the epitaxial layer from a side of the second conductivity type cladding layer to at least the AlGaN-based active layer to partially expose the first conductivity type cladding layer,
- disposing an ohmic electrode on each of the partially exposed first conductivity type cladding layer and the second conductivity type cladding layer that is left unremoved,
- by removing the planarization layer on the first support substrate, separating the seed crystal layer and the epitaxial layer left on the seed crystal layer from the first support substrate to produce an ultraviolet light emitting device.

With such a method for producing an ultraviolet light emitting device, it is possible to produce a high quality ultraviolet light emitting device with a simple structure and without warpage or defects due to lattice mismatch. Moreover, since the expensive seed crystal layer can be made extremely thin, it can be produced at extremely low cost.

The present invention also provides a method for producing an ultraviolet light emitting device array, comprising combining a plurality of the ultraviolet light emitting devices produced by the above ultraviolet light emitting device producing method to produce an ultraviolet light emitting device array.

With such a method for producing an ultraviolet light emitting device array, it is possible to produce an extremely high quality and inexpensive ultraviolet light emitting device array.

Further, the present invention provides a method for producing a metal bonded substrate for an ultraviolet light emitting device, comprising,

- preparing the above epitaxial wafer for an ultraviolet light emitting device,
- temporarily bonding a side of the second conductivity type cladding layer of the epitaxial layer to a temporary support substrate,
- separating the seed crystal layer, the epitaxial layer on the seed crystal layer, and the temporary support substrate from the first support substrate by removing the planarization layer on the first support substrate,
- after forming a reflective metal layer on a side of the seed crystal layer opposite to the epitaxial layer, and bonding the reflective metal layer to a conductive second support substrate by metal bonding,
- separating a structure comprising the second support substrate, the reflective metal layer, the seed crystal layer and the epitaxial layer from the temporary support substrate to produce a metal bonded substrate for an ultraviolet light emitting device.

With such a method for producing a metal bonded substrate for an ultraviolet light emitting device, a high quality metal bonded substrate for an ultraviolet light emitting device can be produced with a simple structure and without warpage or defects due to lattice mismatch.

Further, the second support substrate may be one of single crystal such as Si, Ge, GaAs, metal such as Cu, Al, and carbon, or a composite material thereof.

By doing so, it is possible to produce a metal bonded substrate for an ultraviolet light emitting device more simply.

At least Au can be used when bonding the reflective metal layer and the second support substrate by metal bonding.

Au is preferable because it is a material often used in metal bonding.

Also, the reflective metal layer can be made of Al.

Al is preferable because it is a material that is often used as a reflective metal in light-emitting devices.

Further, the present invention provides a method for producing an ultraviolet light emitting device, comprising,

- preparing a metal bonded substrate for an ultraviolet light emitting device produced by the above method for producing a metal bonded substrate for an ultraviolet light emitting device,
- removing part of the epitaxial layer from the side of the second conductivity type cladding layer to at least the AlGaN-based active layer to partially expose the first conductivity type cladding layer;
- disposing an ohmic electrode on each of the partially exposed first conductivity type cladding layer and the second conductivity type cladding layer that is left unremoved to produce the ultraviolet light emitting device.

Or, the present invention provides a method for producing an ultraviolet light emitting device, comprising,

- preparing a metal bonded substrate for an ultraviolet light emitting device produced by the above method for producing a metal bonded substrate for an ultraviolet light emitting device,
- disposing ohmic electrodes on the epitaxial layer and on a side of the second supporting substrate opposite to the epitaxial layer, respectively, to produce the ultraviolet light emitting device.

With these producing methods, it is possible to produce a high quality ultraviolet light emitting device with a simple structure and without warpage or defects due to lattice mismatch. Moreover, since the expensive seed crystal layer can be made extremely thin, it can be produced at extremely low cost.

Advantageous Effects of Invention

As described above, the epitaxial wafer for an ultraviolet light emitting device, the method for producing a metal bonded substrate for an ultraviolet light emitting device, and the method for producing an ultraviolet light emitting device according to the present invention can provide a high quality ultraviolet light emitting device with a simple structure, and without warpage and defects due to lattice mismatch generate, or an epitaxial wafer capable of producing it. Moreover, since the expensive seed crystal layer can be made extremely thin, it can be produced at extremely low cost.

Further, according to the method for manufacturing an ultraviolet light emitting device array of the present invention, an extremely high quality and inexpensive ultraviolet light emitting device array can be produced.

BRIEF DESCRIPTION OF DRAWINGS

FIG. 1 is a schematic diagram showing an example of an epitaxial wafer for an ultraviolet light emitting device according to the present invention.

FIG. 2 is a schematic diagram showing an example of the configuration of an ultraviolet light emitting device layer.

FIG. 3 shows an example of an epitaxial wafer for a light-emitting diode in the deep ultraviolet range of a Comparative Example.

FIG. 4 is a schematic diagram showing an example of a PR pattern forming step in the method for producing an ultraviolet light emitting device of the present invention.

FIG. 5 is a schematic diagram showing an example of a process for forming a designed device isolation region.

FIG. 6 is a schematic diagram showing an example of a PR pattern forming step.

FIG. 7 is a schematic diagram showing an example of a patterning process by ICP processing.

FIG. 8 is a schematic diagram showing an example of an n-side electrode forming process.

FIG. 9 is a schematic diagram showing an example of a p-side electrode forming process.

FIG. 10 is a schematic diagram showing an example of a first support substrate separating step.

FIG. 11 is a schematic diagram showing an example of a temporary bonding step in the method of producing a metal bonded substrate for an ultraviolet light emitting device according to the present invention.

FIG. 12 is a schematic diagram showing an example of a first support substrate separating step.

FIG. 13 is a schematic diagram showing an example of a process for forming a reflective metal layer and the like.

FIG. 14 is a schematic diagram showing an example of a permanent bonding substrate preparation process.

FIG. 15 is a schematic diagram showing an example of a metal bonding process.

FIG. 16 is a schematic diagram showing an example of a temporary support substrate separation step.

FIG. 17 is a schematic diagram showing an example of a patterning step by ICP processing in another method for producing an ultraviolet light emitting device of the present invention.

FIG. 18 is a schematic diagram showing an example of a patterning process by ICP processing.

FIG. 19 is a schematic diagram showing an example of an n-side electrode forming process.

FIG. 20 is a schematic diagram showing an example of a p-side electrode forming process.

FIG. 21 is a schematic diagram showing an example of a temporary bonding step in the method of producing a metal bonded substrate for an ultraviolet light emitting device according to the present invention.

FIG. 22 is a schematic diagram showing an example of a step of separating the first support substrate.

FIG. 23 is a schematic diagram showing an example of a process of forming a reflective metal layer and the like.

FIG. 24 is a schematic diagram showing an example of a permanent bonding substrate preparation process.

FIG. 25 is a schematic diagram showing an example of a metal bonding process.

FIG. 26 is a schematic diagram showing an example of a temporary support substrate separation step.

FIG. 27 is a schematic diagram showing an example of a patterning step by ICP processing in another method for producing an ultraviolet light emitting device of the present invention.

FIG. 28 is a schematic diagram showing an example of a p-side electrode formation process.

FIG. 29 is a schematic diagram showing an example of a lower electrode forming process.

FIG. 30 is a schematic diagram showing an example of a metal film removing process.

FIG. 31 is a schematic diagram showing an example of an individual device isolation process.

DESCRIPTION OF EMBODIMENTS

First Embodiment

First, an epitaxial wafer for an ultraviolet light emitting device and a method for producing an ultraviolet light emitting device according to the first embodiment of the present invention will be described.

As described above, there has been a demand for inexpensive, high quality epitaxial wafers suitable for light emitting diodes in the deep ultraviolet region (UVC: 200-250 nm).

As a result of extensive studies, inventors of the present invention have found that by an epitaxial wafer for an ultraviolet light emitting device, comprising, a heat-resistant first support substrate, a planarization layer with a thickness of 0.5 to 3 μm provided on at least upper surface of the first supporting substrate, a group III nitride single crystal seed crystal layer with a thickness of 0.1 to 1.5 μm, which is bonded to upper surface of the planarization layer by bonding, on the seed crystal layer, an epitaxial layer comprising at least a first conductivity type cladding layer containing $Al_xGa_{1-x}N$ ($0.5<x\leq1$) as a main component, an AlGaN-based active layer, and a second conductivity type cladding layer containing $Al_yGa_{1-y}N$ ($0.5<y\leq1$) as a main component being laminated and grown in order, an inexpensive and high quality epitaxial wafer can be provided, and have completed the present invention.

Description will be made below with reference to the drawings.

An epitaxial wafer 100 for an ultraviolet light emitting device of the present invention shown in FIG. 1 has a substrate (bonded substrate) 1 produced by bonding and an ultraviolet light emitting device layer 2 made of a nitride semiconductor. The bonded substrate 1 comprises a heat-resistant support substrate (first support substrate) 3, a planarization layer 7 having a thickness of 0.5 to 3 μm at least on the upper surface, and a group III nitride single crystal having a thickness of 0.1 to 1.5 μm is bonded as the seed crystal layer 4.

The heat-resistant support substrate 3 is composed of a ceramic core layer 5 and an impurity encapsulation layer 6 encapsulating the ceramics core layer, and the impurity encapsulation layer is represented by a composition formula of $SiO_xN_y$ (x=0 to 2, y=0 to 1.5, x+y>0). With such a structure, it is possible to prevent substances derived from the ceramic material of the ceramic core layer 5 from leaking out of the heat-resistant support substrate 3.

The ceramic core layer 5 is made of ceramics containing AlN as a main component, for example. It is excellent in terms of heat resistance, stability, and availability.

The planarization layer may be formed on only one side (upper surface) of the heat-resistant support substrate 3, or may be formed on both sides. With the above thickness, various voids and irregularities caused by the heat-resistant support substrate and the like can be filled, sufficient smoothness can be obtained for transferring the seed crystal, and warpage is less likely to generate. For example, it can be made of at least one of $SiO_2$, silicon oxynitride ($Si_xO_yN_z$), Si, and AlAs. It is preferable because it is easy to grind and polish when it is planarized, and it easily becomes a sacrificial layer for separating the heat-resistant support substrate 3 later.

The bonded substrate 1 is produced by, for example, forming a heat-resistant support substrate 3 having a planarization layer 7 formed thereon and a seed crystal layer 4 in a process disclosed in an earlier application (Japanese Patent Application No. 2020-100528) filed by the applicant of the present application. It can be made by bonding, but is not limited to the method described in the above application.

Also, by setting the thickness of the seed crystal layer 4 within the above numerical range, the quality can be improved. Considering the film (ultraviolet light emitting device layer 2) to be epitaxially grown thereon, it is particularly preferable to use a single crystal of $Al_xGa_{1-x}N$ ($0.5<X\leq1$) as the material.

Furthermore, it is preferable that the bandgap of the seed crystal layer 4 is larger than the bandgap of the AlGaN-based active layer, which will be described later. This is because the light can be extracted more efficiently. In order to emit light more efficiently, the epitaxial growth surface of the seed crystal layer 4 is preferably the C-plane.

The ultraviolet light emitting device layer 2 is vapor phase grown on the bonded substrate 1. An outline of the ultraviolet light emitting device layer is shown in FIG. 2. Below, the structure of the ultraviolet light emitting device layer 2 is described in detail.

A first conductivity type cladding layer 8 (mainly composed of $Al_xGa_{1-x}N$ ($0.5<x\leq1$)) is formed on the bonded substrate 1. The first conductivity type cladding layer 8 is formed to supply electrons to the AlGaN-based active layer 9, and although the film thickness is not particularly limited, it can be, for example, 1.0 to 5.6 μm. As an example, it can be 2.5 μm.

An AlGaN-based active layer 9 has a quantum well structure, in which barrier layers 10 and well layers 11 are alternately laminated. In addition, for example, In is present as a constituent element other than Al, Ga, and N, and the ratio of In can be less than 1%, which is preferable because light can be emitted more efficiently. The lower limit of the In content can be greater than 0%. In addition, the AlGaN-based active layer can have a peak wavelength λp of the spectrum emitted when a current of 0.2 $A/mm^2$ is injected at 25° C. is shorter than 235 nm. With such a thing, a deep ultraviolet light can be obtained more reliably. The lower limit of this peak wavelength λp can be set to 200 nm, for example. The thickness of the AlGaN-based active layer 9 can be, for example, 0.2 to 0.6 μm.

A second conductivity type cladding layer 12 (mainly composed of $Al_yGa_{1-y}N$ ($0.5<y\leq1$)) is formed to supply holes to the AlGaN-based active layer 9. The film thickness of the second conductivity type cladding layer 12 can be, for example, 0.5 to 2.5 μm.

A p-type GaN contact layer 13 is formed to reduce the contact resistance with the electrode. The thickness of the p-type GaN contact layer 13 can be, for example, 0.05 to 0.3 μm.

The above described first conductivity type cladding layer 8 to p-type contact layer 13 are sometimes referred to as an epitaxial layer 22 below.

A method of producing an epitaxial layer suitable for the deep ultraviolet light emitting diode of this embodiment will be described below.

[1] Introduction to Reaction Furnace

The bonded substrate 1 is introduced into a reaction furnace of an MOVPE apparatus. Before the bonded substrate 1 is introduced into the reaction furnace, it is cleaned with a chemical. After the bonded substrate 1 is introduced into the reaction furnace, the reaction furnace is filled with a high-purity inert gas such as nitrogen, and the gas in the reaction furnace is exhausted.

[2] Step of Cleaning the Surface of the Bonded Substrate in a Furnace

The bonded substrate 1 is heated in a reaction furnace to clean the surface of the substrate. The temperature for cleaning can be determined between 1000° C. and 1200° C. in terms of temperature of the surface of the bonded substrate, and cleaning at 1050° C. in particular can provide a clean surface.

Cleaning is performed after the pressure inside the furnace is reduced, and the pressure inside the furnace can be determined between 200 mbar and 30 mbar. The furnace is cleaned for, for example, 10 minutes while hydrogen or nitrogen is supplied.

[3] Step of Growing the First Conductivity Type Cladding Layer 8

This step is a step of growing the first conductivity type cladding layer 8 on the bonded substrate 1.

In this step, after the inside of the reaction furnace is maintained at a specified furnace pressure and substrate temperature, raw materials TMAl, TMGa, $NH_3$ and an impurity gas for n-type conductivity are supplied into the furnace, and the first conductivity type cladding layer 8 is grown. The first conductivity type cladding layer 8 can be freely produced with a composition represented by $Al_xGa_{1-x}N$ ($0.5<x\leq1$), and was designed as $Al_{0.95}Ga_{0.05}N$ as an example. A plurality of layers may be formed by changing the composition.

The furnace pressure in this process can be, for example, 75 mbar, and the substrate temperature can be 1100° C. In order to obtain a mixed crystal with a desired Al composition, the flow rates of the raw materials TMAl and TMGa are adjusted so that the Al/Ga ratio taken into the thin film is a set ratio, taking into consideration the material efficiency of the source gases.

Monosilane ($SiH_4$) can be used as an impurity gas for n-type conductivity. Further, the carrier gas for transporting the raw material gas can be hydrogen.

Tetraethylsilane may be used as the impurity gas.

[4] Step of Growing AlGaN-Based Active Layer 9

This step is a step of growing the AlGaN-based active layer 9 on the first conductivity type cladding layer 8. In this step, after the inside of the reaction furnace is maintained at a prescribed furnace pressure and substrate temperature, raw materials TMAl, TMGa, and $NH_3$ are supplied into the furnace to grow the AlGaN-based active layer 9. For example, the AlGaN-based active layer 9 may be formed by alternately stacking a barrier layer 10: $Al_{0.75}Ga_{0.25}N$ and a well layer 11: $Al_{0.6}Ga_{0.4}N$. Further, the furnace pressure in this process can be, for example, 75 mbar, and the substrate temperature can be 1100° C. In order to obtain a mixed crystal with a desired Al composition in each layer, the flow rates of the raw materials TMAl and TMGa are adjusted so that the Al/Ga ratio taken into the thin film becomes a set ratio in consideration of the material efficiency of the raw material gas.

[5] Step of Growing the Second Conductivity Type Cladding Layer 12

This step is a step of growing the second conductivity type cladding layer 12 on the AlGaN-based active layer 9. In this step, after the inside of the reaction furnace is maintained at a specified furnace pressure and substrate temperature, raw materials TMAl, TMGa, and $NH_3$, and impurity raw materials for making p-type conductivity are supplied into the furnace, followed by a step of growth of the second conductivity type cladding layer 12. The second conductivity type cladding layer 12 can be freely manufactured with a composition represented by $Al_yGa_{1-y}N$ (0.5<y≤1), and as an example, it can be $Al_{0.95}Ga_{0.05}N$. A plurality of layers may be formed by changing the composition.

The furnace pressure in this process can be, for example, 75 mbar, and the substrate temperature can be 1100° C. In order to obtain a mixed crystal with a desired Al composition, the flow rates of the raw materials TMAl and TMGa are adjusted so that the Al/Ga ratio taken into the thin film is a set ratio, taking into consideration the material efficiency of the source gases.

Biscyclopentadienylmagnesium (Cp2Mg) can be used as an impurity material for providing p-type conductivity.

[6] Step of Growing the p-Type GaN Contact Layer 13

This step is a step of growing the p-type GaN contact layer 13 on the second conductivity type cladding layer 12. In this step, after the inside of the reaction furnace is maintained at a specified furnace pressure and substrate temperature, raw materials TMGa, $NH_3$, and impurity raw materials for making p-type conductivity are supplied into the furnace to grow a p-type GaN contact layer 13. The furnace pressure in this process can be, for example, 200 mbar and the substrate temperature can be 1000° C.

Biscyclopentadienylmagnesium (Cp2Mg) can be used as an impurity raw material for p-type conductivity. Further, hydrogen can be used as a carrier gas for transporting the raw material gas.

[7] Activation Annealing Step

In this step, the p-type impurities in the second conductivity type cladding layer 12 and the p-type GaN contact layer 13 were activated by annealing the wafer at a predetermined temperature and time in a heating furnace. Activation in the heating furnace can be performed at 750° C. for 10 minutes, for example.

The epitaxial wafer for light emitting diodes in the deep ultraviolet region of the present invention does not cause in-plane non-uniformity due to warpage due to differences in lattice constants and thermal expansion coefficients, and can be high quality wafers with low dislocation density.

In addition, for example, by peeling off a thin seed crystal layer from an expensive free-standing AlN single crystal substrate and bonding it to an inexpensive ceramic substrate, it is possible to inexpensively manufacture an epitaxial substrate for light-emitting diodes in the deep ultraviolet region.

Next, a method for producing an ultraviolet light emitting device according to the present invention will be described with reference to FIGS. 4 to 10 (flip chip).

First, as shown in FIG. 4, a thick-film photoresist (PR) is spin-coated on an epitaxial wafer (epitaxial substrate) 100 for ultraviolet light emitting devices, a resist of 3 μm or more is formed on the surface, and photolithography is used so that PR pattern 14 is formed. The PR pattern can have, for example, a pitch of 15 μm and a square of 10 μm, but not limited to this size and can be changed according to desired product.

The lower limit of the size of the PR pattern and the pitch are determined by the thickness from the seed crystal layer 4 to the p-type GaN contact layer 13, and should be 1/20 or more of the difference in pattern dimension from the pitch interval. That is, when a pattern of 15 μm pitch and 10 μm square is formed, the difference needs to be 0.4 μm or more.

Next, as shown in FIG. 5, patterning is performed by ICP processing. The ICP conditions are $Cl_2$ flow rate of 50 sccm, Ar flow rate of 30 sccm, processing pressure atmosphere of 2 [Pa], output power of 150 W on the bias side and 100 W on the antenna side, while introducing $Cl_2$ and Ar. Needless to say, the conditions are not limited to these, and any conditions can be selected as long as the epitaxial layer can be etched. A designed device isolation region 15 is formed by removing the epitaxial layer down to the bonded substrate 1 by ICP processing. After forming the regions 15, the PR pattern 14 is removed by ashing.

Next, as shown in FIG. 6, a thick-film photoresist (PR) is spin-coated to form a resist having a thickness of 3 μm or more on the surface, and a PR pattern 16 is formed by photolithography.

Next, as shown in FIG. 7, patterning is performed by ICP processing. The ICP conditions are $Cl_2$ flow rate of 50 sccm, Ar flow rate of 30 sccm, processing pressure atmosphere of 2 [Pa], output power of 150 W on the bias side and 100 W on the antenna side, while introducing $Cl_2$ and Ar. The conditions are not limited to these, and any conditions can be selected as long as the epitaxial layer can be etched.

By adjusting the ICP processing time, a region 17 is formed in which the n-type AlGaN layer (first conductivity type cladding layer) 8 is left in a thickness of about 0.5 to 1.5 μm (partial exposure of the first conductivity type cladding layer). After forming the region 17, the PR pattern 16 is removed by ashing.

A thin-film PR (thickness of 3 μm or less) is spin-coated, and a pattern in which a part of the region 17 is opened and the other region is covered with PR is formed by photolithography. The opening pattern can be, for example, a 4 μm square pattern, but is not limited to this size.

Next, as shown in FIG. 8, the wafer is introduced into a vapor deposition apparatus and vapor deposition is performed. The deposited films can be deposited in order, for example, with a Ni layer of 100 nm and an Au layer of 1,000 μm. After the deposition film is formed, the metal film is removed from the regions other than the opening by the lift-off method, and the n-side electrode 18 is formed in a part of the region 17.

A similar effect can also be obtained by adopting a self-alignment process in which an opening pattern is formed by wet etching after the surface protective film (PSV) is formed, and lift-off is performed after vapor deposition.

Next, as shown in FIG. 9, after forming the n-side electrode 18, a thin-film PR (thickness of 3 μm or less) is spin-coated, and a portion of the p-type GaN contact layer 13 is opened by photolithography and other area is coated with PR to form a pattern. The opening pattern can be, for example, a 4 μm square pattern, but is not limited to this size.

After forming the opening pattern, the wafer is introduced into the vapor deposition apparatus and vapor deposition is performed. The vapor deposition film can be formed with an Al layer of 1,000 μm, for example. After forming the vapor deposition film, the metal film in the region other than the opening is removed by the lift-off method, and the p-side electrode 19 is formed on a part of the p-type GaN contact layer 13 (that is, on the second conductivity type cladding layer left without being removed).

A similar effect can also be obtained by adopting a self-alignment process in which an opening pattern is formed by wet etching after the surface protective film (PSV) is formed, and lift-off is performed after vapor deposition.

After forming the n-side electrode 18 and p-side electrode 19, heat treatment is performed in a nitrogen atmosphere at, for example, 700° C. for 5 minutes to form an electrical contact of the epitaxial layer.

Next, as shown in FIG. 10, the epitaxial substrate 100 is held so that at least the p-side electrode 19 and the ELEP tape are in contact with each other, and the $SiO_2$ layer (planarization layer) 7 of the epitaxial substrate 100 is wet etching treated with a hydrofluoric acid/hydrogen peroxide mixed solution. Hydrofluoric acid/hydrogen peroxide etching only etch the $SiO_2$ layer 7 and has etching selectivity with respect to the AlN layer (seed crystal layer) 4. Therefore, since the base substrate (first support substrate: ceramics core layer+impurity encapsulation layer) 3 and the AlN layer 4 are separated, the chips become independent.

Being Transferred the independent chips to an appropriate transfer material such as silicone, they are mounted on a mounting board.

A plurality of chips (ultraviolet light emitting diodes) produced by the method for producing an ultraviolet light emitting diode as described above can be combined to produce an ultraviolet light emitting diode array. In this way, it is possible to produce an extremely high quality and inexpensive ultraviolet light emitting diode array.

Second Embodiment

Next, a method for producing a metal-bonded substrate for an ultraviolet light emitting device and a method for producing an ultraviolet light emitting device according to the second embodiment of the present invention will be described with reference to FIGS. 11 to 20.

First, as shown in FIG. 11, a benzocyclobutene (BCB) film 20 is applied on an epitaxial substrate 100 by spin coating to a thickness of, for example, 1 μm. A temporary support substrate 21 is prepared, and it is made to face the surface of the epitaxial substrate 100 coated with the BCB film 20, and it is temporarily bonded by thermocompression to obtain a temporary bonded substrate 101. Although any material can be selected for the temporary support substrate, for example, silicon, which has excellent material for flattening, can be used. In addition, materials such as sapphire, quartz, GaAs, InP, SiC, Ge, and InSb may be selected. Temporary bonding conditions can be, for example, 5 N/cm$^2$ or more and a temperature of about 150° C.

Next, as shown in FIG. 12, the $SiO_2$ layer (planarization layer) 7 on the substrate is wet etching treated with a hydrofluoric acid/hydrogen peroxide mixed solution. Only the $SiO_2$ layer is etched with hydrofluoric acid/hydrogen peroxide, and since it has etching selectivity with respect to the epitaxial layer 22, the substrate 3 and the seed crystal layer 4 are separated, and the seed crystal layer 4 to the temporary support substrate 21 remains on the temporary bonded substrate 101 to obtain a separation substrate 23.

Next, as shown in FIG. 13, for example, an Al layer (reflective metal layer) 24 having a thickness of 0.5 μm, a Ti layer 25 having a thickness of 0.1 μm and an Au layer 26 having a thickness of 1 μm are formed in this order on the separation substrate 23 (on the side opposite to the epitaxial layer 22 of the seed crystal layer 4) by a vacuum deposition method to obtain a separation bonding substrate 27. A vapor deposition film may be formed using a sputtering method, PLD, ALD, or other deposition method other than the vapor deposition using the vacuum vapor deposition method. Also, even if the film thickness is thicker or thinner than the exemplified film thickness, the same effect can be obtained. However, since the Al layer 24 is provided for the purpose of having a function of reflecting light generated in the active layer, it is preferably 0.05 μm or more, and it is desirably 5 μm or less for ease of processing in the subsequent chip process. The Ti layer 25 is a layer provided to prevent mixing of the Al layer 24 and the Au layer 26, and it is desirable to provide a thickness of 0.05 μm or more, which has the least effect. In addition, it is desirable that the thickness is 5 μm or less from the viewpoint of ease of processing in the subsequent chip process. The Au layer 26 is a layer provided for the purpose of the function of metal bonding, and preferably has a thickness of 0.3 μm or more in order to secure bonding easiness. In addition, it is desirable that the thickness is 5 μm or less from the viewpoint of ease of processing in the subsequent chip process.

Next, as shown in FIG. 14, a silicon substrate is prepared as a permanent substrate 28 (conductive second support substrate), and a bonding metal film is vapor deposited on the permanent substrate 28. As bonding metals, a permanent bonding substrate 31 is prepared by a vacuum vapor deposition method, for example, a 0.1 μm thick Ti layer 29 and a 1 μm thick Au layer 30 in order from a permanent substrate 28.

It should be noted that the second support substrate can be any one of single crystals of Si, Ge, GaAs, metals of Cu and Al, and carbon, or a composite material thereof. Such materials are more convenient.

A vapor deposition film may be formed using a sputtering method, PLD, ALD, or other deposition method other than the vapor deposition using the vacuum vapor deposition method. Also, even if the film thickness is thicker or thinner than the exemplified film thickness, the same effect can be obtained. However, the Ti layer 29 is a layer provided for the purpose of bonding the Au layer 30 and the silicon substrate, and it is desirable to provide a thickness of 0.05 μm or more, which has the least effect. In addition, it is desirable that the thickness is 5 μm or less from the viewpoint of ease of processing in the subsequent chip process. The Au layer 30 is a layer provided for the purpose of the function of metal bonding, and preferably has a thickness of 0.3 μm or more in order to secure bonding easiness. In addition, it is desirable that the thickness is 5 μm or less from the viewpoint of ease of processing in the subsequent chip process.

Next, as shown in FIG. 15, the separation bonding substrate 27 and the permanent bonding substrate 31 are bonded by thermocompression so that the Au layer 26 and the Au layer 30 face each other to obtain a bonding substrate 102 (metal bonding). The bonding conditions can be, for example, 5 N/cm$^2$ or more and the temperature is around 150° C.

Next, as shown in FIG. 16, the BCB film 20 is softened by heating to 150° C., and the temporary support substrate 21 is separated from the bonding substrate 102 to obtain a component substrate 32 (metal bonded substrate for ultraviolet light emitting device: a component containing a second support substrate, a reflective metal layer, a seed crystal layer, and an epitaxial layer).

The BCB film 20 left on the surface of the component substrate 32 can be removed by $NF_3$ gas plasma treatment by the ICP method. The method for removing the BCB film 20 is not limited to this, and any method that can remove the BCB film may be used. For example, it can be similarly removed by cleaning with a BCB thinning liquid or oxygen plasma treatment.

Next, the producing method of the ultraviolet light emitting device of the present invention using the component substrate 32 will be described with reference to FIGS. 17-20.

First, a thick-film photoresist (PR) is spin-coated on the surface of the component substrate 32, a resist of 3 μm or more is formed on the surface, and a PR pattern is formed by photolithography. The PR pattern can be configured with, for example, a pitch of 350 μm and a square of 350 μm, but not limited to this size and can be changed according to desired product.

Next, as shown in FIG. 17, patterning is performed by ICP processing after PR pattern is formed. The ICP conditions are $Cl_2$ flow rate of 50 sccm, Ar flow rate of 30 sccm, processing pressure atmosphere of 2 [Pa], output power of 150 W on the bias side and 100 W on the antenna side. The patterning conditions are not limited to these, and any conditions can be selected as long as the epitaxial layer can be etched. By ICP processing, the epitaxial layer is removed until the Al layer 24 is exposed to form a designed device isolation region 33. After forming the designed device isolation region 33, the PR pattern is removed by asking.

Next, a thick-film photoresist (PR) is spin-coated to form a resist of 3 μm or more on the surface, and a PR pattern is formed by photolithography.

Next, as shown in FIG. 18, patterning is performed by ICP processing. The ICP conditions are $Cl_2$ flow rate of 50 sccm, Ar flow rate of 30 sccm, processing pressure atmosphere of 2 [Pa], output power of 150 W on the bias side and 100 W on the antenna side. The patterning conditions are not limited to these, and any conditions can be selected as long as the epitaxial layer can be etched.

By adjusting the ICP processing time, a region 34 is formed in which the n-type AlGaN layer 8 is left to a thickness of about 0.5 to 1.5 μm. After forming the region 34, the PR pattern is removed by ashing.

Next, as shown in FIG. 19, a thin-film PR (thickness of 3 μm or less) is spin-coated, and photolithography is used to form a pattern in which a part of the region 34 is opened and the other region is covered with PR. The opening pattern can be, for example, a pattern of 70 μmΦ, but is not limited to this size, and may be larger or smaller than this size.

After forming the opening pattern, the wafer is introduced into a vapor deposition apparatus and vapor deposition is performed. The deposited film can be deposited, for example, with a Ni layer of 100 nm and an Au layer of 1,000 μm in this order. After forming the deposited film, the lift-off method is used to remove the metal film in the region other than the opening, and the n-side electrode 35 is formed in a part of the region 34.

Also, after forming the surface protection (PSV) film, an opening pattern may be formed by wet etching, and after vapor deposition, a self-alignment process may be employed in which lift-off is performed.

Next, as shown in FIG. 20, a thin-film PR (thickness of 3 μm or less) is spin-coated, and a pattern in which a portion of the p-type GaN layer 13 is opened and other regions are covered with PR is formed by photolithography. The opening pattern can be, for example, a pattern of 70 μmΦ, but is not limited to this size, and may be larger or smaller than this size.

After forming the opening pattern, the wafer is introduced into the vapor deposition apparatus and vapor deposition is performed. The deposited film can be, for example, an Al layer of 1,000 μm. After forming the vapor deposition film, the metal film in the region other than the opening is removed by the lift-off method, and the p-side electrode 36 is formed on a part of the p-type GaN contact layer 13.

Also, after forming the surface protection (PSV) film, an opening pattern may be formed by wet etching, and after vapor deposition, a self-alignment process may be employed in which lift-off is performed.

After forming the n-side electrode 35 and the p-type electrode 36, heat treatment is performed in a nitrogen atmosphere at 700° C. for 5 minutes to form an electrical contact of the epilayer.

After the electrical contact is formed, the metal film on a part of the region 33 is removed, and the device is separated into individual devices by scribing/breaking method.

A laser ablation method can be used to remove the metal film, but it is not limited to this, and a wet etching method covering the device region may be used. When using the wet method, it is preferable to use aqua regia.

In addition, it is not limited to the scribing/breaking method, and other methods may be used. For example, a blade dicing method can also be used. As for the scribing method, either the diamond scribing method or the stealth method can be employed.

Third Embodiment

Next, a method for producing a metal bonded substrate for an ultraviolet light emitting device and a method for producing an ultraviolet light emitting device according to the third embodiment of the present invention will be described with reference to FIGS. 21 to 31.

First, as shown in FIG. 21, a benzocyclobutene (BCB) film 20 is applied on an epitaxial substrate 100 by spin coating to a thickness of, for example, 1 μm. A temporary support substrate 21 is prepared, and it is made to face the surface of the epitaxial substrate 100 coated with the BCB film 20, and it is temporarily bonded by thermocompression to obtain a temporary bonded substrate 101. Although any material can be selected for the temporary support substrate, for example, silicon, which has excellent material for flattening, can be used. In addition, materials such as sapphire, quartz, GaAs, InP, SiC, Ge, and InSb may be selected. The conditions for temporary bonding can be, for example, 5 $N/cm^2$ or more and the temperature can be around 150° C.

Next, as shown in FIG. 22, the $SiO_2$ layer (planarization layer) 7 on the substrate is wet etching treated with a hydrofluoric acid/hydrogen peroxide mixed solution. Only the $SiO_2$ layer is etched with hydrofluoric acid/hydrogen peroxide, and since it has etching selectivity with respect to the epitaxial layer 22, it is separated between the substrate and the seed crystal layer 4, and a separation substrate 23 in which from the AlN layer (seed crystal layer) 4 to the temporary support substrate 21 remains on the temporary bonded substrate 101 is obtained.

Next, as shown in FIG. 23, for example, an Al layer (reflective metal layer) 24 having a thickness of 0.5 μm, a Ti layer 25 having a thickness of 0.1 μm and an Au layer 26 having a thickness of 1 μm are successively deposited by a vacuum deposition method on the separation substrate 23 (on the side opposite to the epitaxial layer 22 of the seed crystal layer 4) to obtain a separation bonding substrate 27.

A vapor deposition film may be formed using a sputtering method, PLD, ALD, or other deposition method, in addition to vapor deposition by a vacuum vapor deposition method. Also, even if the film thickness is thicker or thinner than the exemplified film thickness, the same effect can be obtained.

Since the Al layer 24 is provided for the purpose of having a function of reflecting light generated in the active layer, it is preferably 0.05 μm or more, and preferably 5 μm or less for ease of processing in the subsequent chip process. The Ti layer 25 is a layer provided to prevent mixing of the Al layer 24 and the Au layer 26, and it is desirable to provide a thickness of 0.05 μm or more, which has the least effect. In addition, it is desirable that the thickness is 5 μm or less from the viewpoint of ease of processing in the subsequent chip process. The Au layer 26 is a layer provided for purpose of the function of metal bonding, and preferably has a thickness of 0.3 μm or more in order to secure bonding easiness. In addition, it is desirable that the thickness is 5 μm or less from the viewpoint of ease of processing in the subsequent chip process.

Next, as shown in FIG. 24, a silicon substrate is prepared as a permanent substrate 28 (conductive second support substrate), and a bonding metal film is vapor deposited on the permanent substrate 28. As bonding metals, for example, a 0.1 μm thick Ti layer 29 and a 1 μm thick Au layer 30 in order from a permanent substrate 28 by a vacuum vapor deposition method to prepare a permanent bonding substrate 31.

A vapor deposition film may be formed using a sputtering method, PLD, ALD, or other deposition method, in addition to vapor deposition by a vacuum vapor deposition method. Also, even if the film thickness is thicker or thinner than the exemplified film thickness, the same effect can be obtained. However, the Ti layer 29 is a layer provided for the purpose of bonding the Au layer 30 and the silicon substrate, and it is desirable to provide a thickness of 0.05 μm or more, which has the least effect. In addition, it is desirable that the thickness is 5 μm or less from the viewpoint of ease of processing in the subsequent chip process. The Au layer 30 is a layer provided for purpose of the function of metal bonding, and preferably has a thickness of 0.3 μm or more in order to secure bonding easiness. In addition, it is desirable that the thickness is 5 μm or less from the viewpoint of ease of processing in the subsequent chip process.

Next, as shown in FIG. 25, the separation bonding substrate 27 and the permanent bonding substrate 31 are bonded by thermocompression so that the Au layer 26 and the Au layer 30 face each other to obtain a bonding substrate 102 (metal bonding). The bonding conditions can be, for example, 5 $N/cm^2$ or more and the temperature can be around 150° C.

Next, as shown in FIG. 26, the BCB film 20 is softened by heating to 150° C., and the temporary support substrate 21 is separated from the bonding substrate 102 to obtain a component substrate 32 (metal bonded substrate for ultraviolet light emitting device).

The BCB film 20 left on the surface of the component substrate 32 can be removed by $NF_3$ gas plasma treatment by the ICP method. The method for removing the BCB film 20 is not limited to this, and any method that can remove the BCB film may be used. For example, it can be similarly removed by cleaning with a BCB thinning liquid or oxygen plasma treatment.

Next, the producing method of the ultraviolet light emitting device of the present invention using the component substrate 32 will be described with reference to FIGS. 27 to 30.

First, a thick-film photoresist (PR) is spin-coated on the surface of the component substrate 32, a resist of 3 μm or more is formed on the surface, and a PR pattern is formed by photolithography. The PR pattern can be configured with, for example, a pitch of 250 μm and a square of 250 μm but not limited to this size and can be changed according to desired product.

Next, as shown in FIG. 27, after forming the PR pattern, patterning is performed by ICP processing. The ICP conditions are $Cl_2$ flow rate of 50 sccm, Ar flow rate of 30 sccm, processing pressure atmosphere of 2 [Pa], output power of 150 W on the bias side and 100 W on the antenna side. The patterning conditions are not limited to these, and any conditions can be selected as long as the epitaxial layer can be etched. For example, RIE processing or reverse sputtering may be used instead of ICP.

A designed device isolation region 33 is formed by removing the epitaxial layer until the Al layer 24 is exposed by ICP processing. After forming the designed device isolation region 33, the PR pattern is removed by ashing.

Next, as shown in FIG. 28, a thin film PR (thickness of 3 μm or less) is spin-coated, and photolithography is used to form a pattern in which a part of the region 34 is opened and the other region is covered with PR. The opening pattern can be, for example, a pattern of 70 μmΦ, but is not limited to this size, and may be larger or smaller than this size.

After forming the opening pattern, the wafer is introduced into a vapor deposition apparatus and vapor deposition is performed. The deposited film can be deposited, for example, with a Ni layer of 100 nm and an Au layer of 1,000 μm in this order. After forming the deposited film, the lift-off method is used to remove the metal film in the region other than the opening, and the p-side electrode 36 is formed in the region 34.

The deposited film is not limited to a laminated structure of Ni and Au layers, and may be a single Al layer or a single Au layer, and any metal material or any laminate structure capable of forming an ohmic contact may be used.

Next, a wafer is introduced as shown in FIG. 29, a lower electrode 38 is formed by performing vapor deposition on the surface side of the component substrate 32 on which the p-side electrode 36 is not formed (the side opposite to the epitaxial layer of the second support substrate). The lower electrode 38 can be formed with an Al layer of 1,000 μm.

Note, it is not limited to the single layer structure of the Al layer, and may be a laminated structure of Ni and Au layers, or a single layer of Au layer, and any metal material or any laminate structure capable of forming an ohmic contact may be used.

After forming the p-side electrode 36 and the lower electrode 38, heat treatment is performed in a nitrogen atmosphere at 700° C. for 5 minutes to form electrical contact with the epitaxial layer and the permanent substrate.

Next, as shown in FIG. 30, after the electrical contact is formed, the metal film in a part of the region 37 is removed.

Then, as shown in FIG. 31, it is separated into individual devices by scribing/breaking method.

A laser ablation method can be used to remove the metal film, but it is not limited to this, and even if a wet etching method covering the device region may be used, similar effects can be obtained. When using the wet method, it is preferable to use aqua regia.

In addition, it is not limited to the scribing/breaking method, and other methods may be used. For example, a blade dicing method can also be used. As for the scribing method, either the diamond scribing method or the stealth method can be employed.

Example

The present invention will be described in more detail with reference to Example and Comparative Example below, but the present invention is not limited to these Examples.

Example

It produces an epitaxial wafer of the present invention as shown in FIGS. 1 and 2 (see the process of the first embodiment described above).

A substrate was prepared by growing a planarization layer 7 made of $SiO_2$ to a thickness of 2 μm on a substrate made of AlN ceramics, and bonding a seed crystal made of $Al_{0.95}Ga_{0.05}N$ single crystal.

$Al_{0.95}Ga_{0.05}N$ was grown to 100 nm on the substrate by the MOVPE method, and n-type $Al_{0.95}Ga_{0.05}N$ was grown thereon to 2.5 μm. A quantum well structure consisting of three layers of barrier layer 10: $Al_{0.75}Ga_{0.25}N$ and well layer 11: $Al_{0.6}Ga_{0.4}N$ was formed thereon. Thereafter, a p-type $Al_{0.95}Ga_{0.05}N$ layer and a p-type GaN contact layer were formed.

In the example, the growth time could be shortened by 6 hours as compared with the comparative example described later. Further, by homoepitaxially growing until the active layer is grown, the warpage during the growth of the active layer is reduced and the uniformity of the active layer is improved. The bow after growth was as small as 12 μm, and no cracks generated.

Comparative Example

A method for producing an epitaxial layer for a light emitting diode in the deep ultraviolet region using the sapphire substrate 115 is shown below (see FIG. 3).

[1] Introduction to Reaction Furnace

The sapphire substrate 115 is introduced into a reaction furnace of an MOVPE apparatus. Before the sapphire substrate 115 is introduced into the reaction furnace, it is cleaned with chemicals. After introducing the sapphire substrate 115 into the reaction furnace, the reaction furnace is filled with a high-purity inert gas such as nitrogen, and the gas in the furnace is exhausted.

[2] Cleaning the Sapphire Substrate 115 in the Furnace

The sapphire substrate 115 is heated in the reaction furnace to clean the surface of the substrate. The temperature for cleaning can be determined between 1000° C. and 1200° C. as the temperature of the surface of the sapphire substrate 115. In particular, cleaning at 1030° C. can provide a clean surface.

Cleaning is performed after the pressure inside the furnace is reduced, and the pressure inside the furnace can be determined between 200 mbar and 30 mbar. In this embodiment, the cleaning was performed with the furnace pressure set to 150 mbar. The cleaning is performed for 10 minutes while hydrogen or nitrogen is supplied into the furnace.

[3] Step of Growing a Buffer Layer 116

In this step, a buffer layer 116 for improving the crystallinity of the epitaxial layer is grown on the sapphire substrate by introducing a gas as a source of raw materials Al, Ga, and N at a specified furnace pressure and substrate temperature. A layer for reducing dislocations was formed by adjusting the nucleation layer 117 on the substrate and the growth conditions, and repeating the low-speed growth layer 118 and the high-speed growth layer 119. In order to obtain a substrate suitable for an ultraviolet LED, the buffer layer 116 was grown to a thickness of 3 μm.

After this, by the same producing method as the method of Example 1 (that is, [3] Step of growing the first conductivity type cladding layer to [7] Activation annealing step in the epitaxial layer producing method of the first embodiment described above), an epitaxial substrate 200 for a light emitting diode in the deep ultraviolet region was produced (first conductivity type cladding layer 108, AlGaN-based active layer 109 (barrier layer 110, well layer 111), second conductivity type cladding layer 112, p-type GaN contact layer 113).

In the comparative example, it was necessary to grow the buffer layer 116 to a thickness of 3 μm or more for improving the crystallinity, which lengthened the growth time of the epitaxial layer and lowered the productivity. The growth rate of AlN can be increased by increasing the supply of group III source material, but the growth rate could not be increased sufficiently because the incorporation of impurities such as carbon increases and the quality of the crystal deteriorates.

In addition, in-plane non-uniformity and crack defects tend to generate due to warpage due to differences in lattice constants and thermal expansion coefficients during growth, and the degree of freedom in designing the epitaxial layer was low. The warpage after growth, Bow was as large as 124 μm, and the yield of the device process decreased.

The present invention is not limited to the above embodiments. The above-described embodiments are just examples, and any examples that substantially have the same configuration and demonstrate the same functions and effects as those in the technical concept disclosed in the claims of the present invention are included in the technical scope of the present invention.

The invention claimed is:

1. A method for producing a metal bonded substrate for an ultraviolet light emitting device, comprising, preparing an epitaxial wafer for an ultraviolet light emitting device, the epitaxial wafer for an ultraviolet light emitting device comprising, a heat-resistant first support substrate, a planarization layer with a thickness of 0.5 to 3 μm provided on at least upper surface of the first supporting substrate, a group III nitride single crystal seed crystal layer with a thickness of 0.1 to 1.5 μm, which is bonded to upper surface of the planarization layer by bonding, on the seed crystal layer, an epitaxial layer comprising a first conductivity type cladding layer containing $Al_xGa_{1-x}N$ ($0.5<x\leq1$) as a main component, an AlGaN-based active layer, and a second conductivity type cladding layer containing $Al_yGa_{1-y}N$ ($0.5<y\leq1$) as a main component being laminated and grown in order, temporarily bonding a side of the second conductivity type cladding layer of the epitaxial layer to a temporary support substrate, separating the seed crystal layer, the epitaxial layer on the seed crystal layer, and the temporary support substrate from the first support substrate by removing the planarization layer on the first support substrate, after forming a reflective metal layer on a side of the seed crystal layer opposite to the epitaxial layer, and bonding the reflective metal layer to a conductive second support substrate by metal bonding, separating a structure comprising the second support substrate, the reflective metal layer, the seed crystal layer and the epitaxial layer from the temporary support substrate to produce a metal bonded substrate for an ultraviolet light emitting device.

2. The method for producing a metal bonded substrate for an ultraviolet light emitting device according to claim 1, wherein the first support substrate is composed of a ceramics core layer and an impurity encapsulation layer encapsulating the ceramics core layer, and the impurity encapsulation layer is represented by a composition formula of $SiO_xN_y$ (x=0 to 2, y=0 to 1.5, x+y>0).

3. The method for producing a metal bonded substrate for an ultraviolet light mitting device according to claim 2, wherein the ceramics core layer is mainly composed of polycrystalline AlN ceramics.

4. The method for producing a metal bonded substrate for an ultraviolet light emitting device according to claim 1, wherein the planarization layer is made of one or more materials selected from $SiO_2$, silicon oxynitride ($Si_xO_yN_z$), Si, and AlAs.

5. The method for producing a metal bonded substrate for an ultraviolet light emitting device according to claim 1, wherein the seed crystal layer is a single crystal of $Al_xGa_{1-x}N$ ($0.5<X\leq1$).

6. The method for producing a metal bonded substrate for an ultraviolet light emitting device according to claim 1, wherein the AlGaN-based active layer has an MQW structure, containing In as a constituent element other than Al, Ga, and N, and the ratio of In is less than 1%.

7. The method for producing a metal bonded substrate for an ultraviolet light emitting device according to claim 1, wherein the AlGaN-based active layer has a peak wavelength Ap of an emission spectrum shorter than 235 nm when a current of 0.2 $A/mm^2$ is injected at 25° C.

8. The method for producing a metal bonded substrate for an ultraviolet light emitting device according to claim 1, wherein a bandgap of the seed crystal layer is larger than a bandgap of the AlGaN-based active layer.

9. The method for producing a metal bonded substrate for an ultraviolet light emitting device according to claim 1, wherein the seed crystal layer has an epitaxial growth surface which is a C-plane.

10. The method for producing a metal bonded substrate for an ultraviolet light emitting device, according to claim 1, wherein the second support substrate is one of single crystal such as Si, Ge, GaAs, metal such as Cu, Al, and carbon, or a composite material thereof.

11. The method for producing a metal bonded substrate for an ultraviolet light emitting device according to claim 1, wherein Au is used when bonding the reflective metal layer and the second support substrate by metal bonding.

12. The method for producing a metal bonded substrate for an ultraviolet light emitting device according to claim 1, wherein the reflective metal layer is made of Al.

13. A method for producing an ultraviolet light emitting device, comprising, preparing a metal bonded substrate for an ultraviolet light emitting device produced by the method for producing a metal bonded substrate for an ultraviolet light emitting device according to claim 1, removing part of the epitaxial layer from the side of the second conductivity type cladding layer to at least the AlGaN-based active layer to partially expose the first conductivity type cladding layer;

disposing an ohmic electrode on each of the partially exposed first conductivity type cladding layer and the second conductivity type cladding layer that is left unremoved to produce the ultraviolet light emitting device.

14. A method for producing an ultraviolet light emitting device, comprising, preparing a metal bonded substrate for an ultraviolet light emitting device produced by the method for producing a metal bonded substrate for an ultraviolet light emitting device according to claim 1, disposing ohmic electrodes on the epitaxial layer and on a side of the second supporting substrate opposite to the epitaxial layer, respectively, to produce the ultraviolet light emitting device.

* * * * *